United States Patent
Matsuyama

(10) Patent No.: US 9,519,599 B2
(45) Date of Patent: Dec. 13, 2016

(54) MEMORY LOCATION DETERMINING DEVICE AND METHOD FOR DETERMINING LOCATIONS OF COMPRESSED DATA IN A MEMORY BY USING FIRST AND SECOND ARITHMETIC OPERATIONS

(71) Applicant: PANASONIC CORPORATION, Osaka (JP)

(72) Inventor: Shinya Matsuyama, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 163 days.

(21) Appl. No.: 14/091,122

(22) Filed: Nov. 26, 2013

(65) Prior Publication Data

US 2014/0089622 A1    Mar. 27, 2014

Related U.S. Application Data

(63) Continuation of application No. PCT/JP2012/003293, filed on May 21, 2012.

(30) Foreign Application Priority Data

Jun. 10, 2011   (JP) ................. 2011-130153

(51) Int. Cl.
*G06F 12/00*   (2006.01)
*G06F 13/00*   (2006.01)
(Continued)

(52) U.S. Cl.
CPC .......... *G06F 13/1631* (2013.01); *G06F 12/04* (2013.01); *G06F 9/30178* (2013.01);
(Continued)

(58) Field of Classification Search
None
See application file for complete search history.

(56) References Cited

U.S. PATENT DOCUMENTS 5,530,826 A    6/1996  Higuchi et al.
7,533,234 B2 *  5/2009  Rudelic .............. G06F 12/0886
                                                          707/999.101
(Continued)

FOREIGN PATENT DOCUMENTS

CN    1106152 A    8/1995
CN    1973287 A    5/2007
(Continued)

OTHER PUBLICATIONS

International Search Report issued in PCT/JP2012/003293, dated Aug. 7, 2012.
(Continued)

*Primary Examiner* — Jared Rutz
*Assistant Examiner* — Marwan Ayash
(74) *Attorney, Agent, or Firm* — McDermott Will & Emery LLP

(57) ABSTRACT

A memory location determining device determines memory locations for storing M pieces of compressed data each of which is compressed from one of M pieces of N-bit data. For each piece of compressed data, the memory location determining device performs a first arithmetic operation on an address value of a corresponding piece of N-bit data, and determines to store X bits of the piece of compressed data and a flag indicating whether or not the piece of compressed data exceeds X bits at a location indicated by the result value of the first arithmetic operation. When the piece of compressed data exceeds X bits, the memory location determining device further performs a second arithmetic operation on the address value of the corresponding piece of N-bit data and determines to store one or more bits of the piece of compressed data other than the X bits.

16 Claims, 18 Drawing Sheets

(51) Int. Cl.
*G06F 13/28* (2006.01)
*G06F 9/22* (2006.01)
*G06F 13/16* (2006.01)
*G06F 12/04* (2006.01)
G06F 9/30 (2006.01)
H03M 7/40 (2006.01)
H03M 7/30 (2006.01)

(52) U.S. Cl.
CPC ..... *G06F 2212/401* (2013.01); *H03M 7/4031* (2013.01); *H03M 7/6058* (2013.01)

(56) References Cited

U.S. PATENT DOCUMENTS

| | | | |
|---|---|---|---|
| 2004/0111710 | A1 | 6/2004 | Chakradhar et al. |
| 2005/0021929 | A1* | 1/2005 | Yamada ............. G06F 9/30178 712/209 |
| 2005/0144387 | A1* | 6/2005 | Adl-Tabatabai .... G06F 12/0862 711/118 |
| 2010/0017561 | A1* | 1/2010 | Yang ................... G06F 13/4239 711/103 |
| 2010/0017578 | A1* | 1/2010 | Mansson ............. G06F 12/023 711/171 |
| 2012/0272123 | A1* | 10/2012 | Yeh ..................... G06F 12/0246 714/773 |

FOREIGN PATENT DOCUMENTS

| | | |
|---|---|---|
| CN | 101692349 A | 4/2010 |
| JP | 05-037789 A | 2/1993 |
| JP | 09-022353 A | 1/1997 |
| JP | 2007-234048 A | 9/2007 |
| WO | 2005/103878 A2 | 11/2005 |

OTHER PUBLICATIONS

Office Action and Search Report issued in corresponding Chinese Patent Application No. 201280028496.2, mailed on Jul. 16, 2015, with partial English translation.

\* cited by examiner

Compression result

Example of code locations

Compression result

Example of code locations

Compression result

Example of code locations

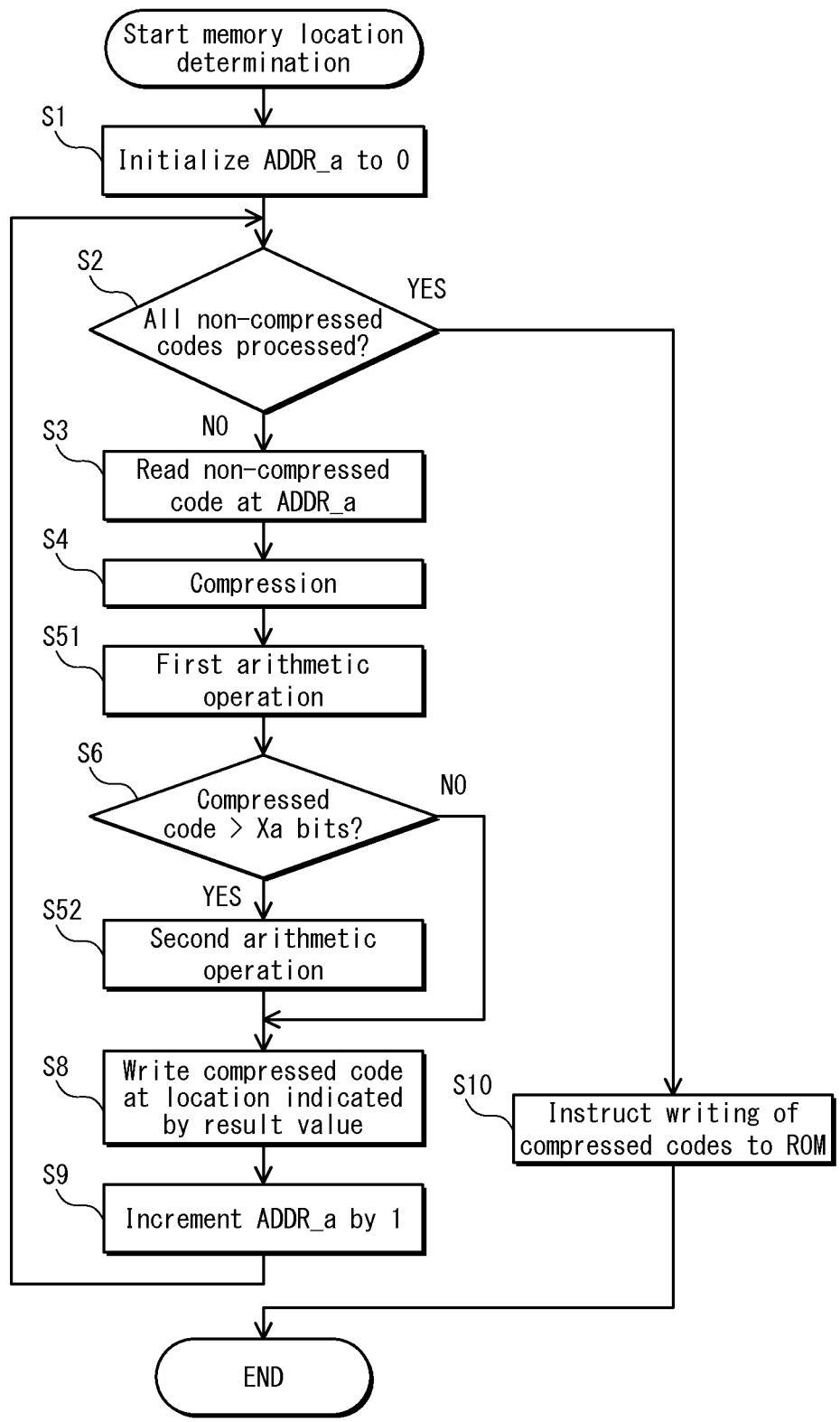

MEMORY LOCATION DETERMINING DEVICE AND METHOD FOR DETERMINING LOCATIONS OF COMPRESSED DATA IN A MEMORY BY USING FIRST AND SECOND ARITHMETIC OPERATIONS

CROSS REFERENCE TO RELATED APPLICATION

This is a continuation application of PCT Application No. PCT/JP2012/003293 filed May 21, 2012, designating the United States of America, the disclosure of which, including the specification, drawings and claims, is incorporated herein by reference in its entirety.

TECHNICAL FIELD

The present invention relates to technologies for memory access by processors.

BACKGROUND ART

For a processor to read a piece of compressed data corresponding to a desired piece of non-compressed data from a memory such as ROM storing a plurality of pieces of compressed data, a technology disclosed for example in Patent Literature 1 is known.

According to the technology disclosed in Patent Literature 1, a processor uses an address translation table to read a variable-length program code that is compressed from a desired program code.

The address translation table stores a pair of address values for each program code. One of the address values in a pair is to be used by the processor to read the program code, and the other indicates a memory location at which a corresponding compressed program code is stored.

That is, according to the technology disclosed in Patent Literature 1, the address value to be used for reading a desired program code is acquired from a processor and translated with the use of an address translation table. In this way, a compressed program code corresponding to the desired program code is read from the memory location indicated by the translated address value.

CITATION LIST

Patent Literature

[Patent Literature 1]
Japanese Patent Application Publication No. 2007-234048

SUMMARY OF INVENTION

Unfortunately, the technology disclosed in Patent Literature 1 requires the processor to refer to the address translation table for reading from memory a compressed program code corresponding to a desired program code. The technology disclosed in Patent Literature 1 therefore requires a memory area for storing the address translation table.

In view of the above, the present invention aims to provide a technology enabling a processor to read a piece of compressed data corresponding to a desired piece of data from memory without having to use an address translation table.

To address the above problem, a memory location determining device according to the present invention is for determining locations in a memory. The locations are for storing M pieces of compressed data each of which is compressed from a corresponding one of M pieces of N-bit data to be less than N bits. The M pieces of N-bit data constitutes a data block. The memory location determining device includes a first determiner and a second determiner. For each of the M pieces of compressed data, the first determiner performs a first arithmetic operation on an address value of a corresponding piece of N-bit data in the data block, and determines a location indicated by a result value of the first arithmetic operation as a location for storing first data of the piece of compressed data. The first data has a length of L bits or less, where L<N. When the piece of compressed data is ordinary compressed data having a length of X bits or less, where X<L<N, the first data includes all bits of the piece of ordinary compressed data and a flag indicates that the length is X bits or less. When the piece of compressed data is special compressed data having a length exceeding X bits, the first data includes X bits of the piece of special compressed data and a flag indicating that the length exceeds X bits. For each piece of special compressed data, the second determiner performs a second arithmetic operation on the address value of the corresponding piece of N-bit data in the data block, and determines a location indicated by a result value of the second arithmetic operation as a location for storing second data of the piece of special compressed data. The second data includes at least one or more bits of the piece of special compressed data other than the X bits. The second arithmetic operation yields a common result value when performed on any address value in a set composed of K address values out of the respective address values of the M pieces of N-bit data and yields a different result value when performed on any address value in a different set, where K≤M.

With the above configuration, the memory location determining device according to the present invention eliminates the need for a processor to use an address translation table to read a piece of compressed data corresponding to a piece of N-bit data desired by the processor from a memory. The memory stores pieces of compressed data at the locations determined by the memory location determining device.

BRIEF DESCRIPTION OF DRAWINGS

FIG. 16 is a flowchart of a memory location determining process performed by the memory location determining device 140.

DESCRIPTION OF EMBODIMENTS

The following describes embodiments of a memory location determining device and a memory access device according to the present invention, with reference to the accompanying drawings.

Embodiment 1

1. Overview

A memory location determining device according to Embodiment 1 determines the locations in a read only memory (ROM), which is one embodiment of a memory according to the present invention. The determined locations are for storing M program codes compressed from M N-bit non-compressed program codes. Hereinafter, a "program code" may be simply referred to as a "code".

The memory location determining device determines the locations for storing respective compressed codes each based on the result value obtained by performing a predetermined arithmetic operation on the address value indicating the location of the corresponding non-compressed code in a non-compressed block formed of the M non-compressed codes.

In particular, the memory location determining device determines the location for storing Xa bits (where Xa<N) of a compressed code based on a result value obtained by performing a first arithmetic operation on the address value indicating the location of the corresponding non-compressed code within the non-compressed block. For each compressed code corresponding to a non-compressed code having a length exceeding Xa bits (hereinafter, such a compressed code may also be referred to as a "special compressed code"), the memory location determining device also determines the location for storing the bits of the special compressed code other than the Xa bits. This location is determined based on a result value obtained by performing a second arithmetic operation on the address value of the corresponding non-compressed code. The details of the first and second arithmetic operations will be described later.

In addition, an access device according to Embodiment 1 specifies the location, in the ROM, storing a compressed code corresponding to a non-compressed code desired by the processor (hereinafter, such a compressed code is referred to as a target compressed code), reads and decompress the compressed code, and sends the resulting non-compressed code to the processor.

Similarly to the memory location determining device described above, the access device also specifies the memory location of the target code in the ROM with the use of the first and second arithmetic operations.

As described above, the memory location determining device and the access device according to Embodiment 1 can respectively determine and specify the location of a compressed code by using the predetermined arithmetic operations (the first and second arithmetic operations) and thus without using an address translation table.

2. Configuration

<2-1. Memory Location Determining Device>

The following now describes the functional configuration of the memory location determining device 100.

Figure 1:
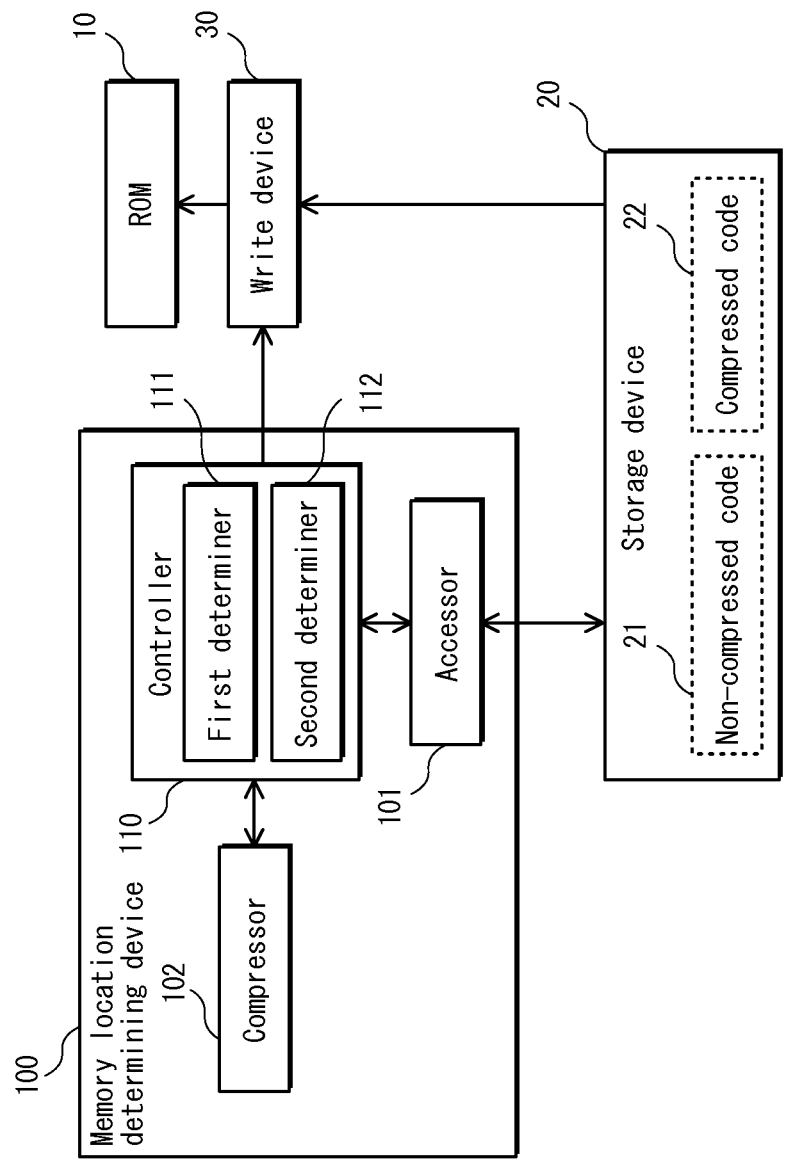
FIG. 1 is a functional block diagram showing important parts of a memory location determining device 100 according to Embodiment 1.

FIG. 1 is a functional block diagram showing important parts of the memory location determining device 100 according to Embodiment 1.

As shown in the figure, the memory location determining device 100 is connected to a storage device 20 and a write device 30 and includes an accessor 101, a compressor 102, and a controller 110. The memory location determining device 100 is a computer having a processor and a memory. The functionalities of the compressor 102 and the controller 110 are implemented by the processor executing a program stored on the memory.

The storage device 20 has a memory area 21 for M non-compressed codes (hereinafter, "non-compressed code area 21") and a memory area 22 for M compressed codes (hereinafter, the compressed code area 22). The accessor 101 has the functionality of accessing the storage device 20 to read non-compressed codes and write compressed codes under instructions from the controller 110.

The compressor 102 has the functionality of compressing an N-bit (16-bit, for example) non-compressed code read by the accessor 101 to generate a compressed code of less than N bits under instructions from the controller 110. The compressor 102 sends the resulting compressed code to the controller 110, along with information indicating the length of the compressed code (hereinafter, such information is referred to as "data-length information").

In addition to the functionality of issuing instructions to the respective functional blocks of the memory location determining device 100, the controller 110 has the functionality of determining the locations for storing in the ROM 10 the compressed codes received from the compressor 102 and causes the accessor 101 to store the compressed codes into the compressed code area 22 of the storage device 20 in the same relative locations as those determined.

The controller 110 includes a first determiner 111 and a second determiner 112.

The first determiner 111 has the functionality of determining the location in the ROM 10 as a location for storing Xa bits (N/2−1 bits, that is equal to 7 bits, in this example)

of the non-compressed code received from the compressor 102. The determination is made by performing a first arithmetic operation on ADDR_a, which is the address value indicating the location of a corresponding non-compressed code in a non-compressed block to yield a result value addr_a1. In the ROM 10, the location indicated by the result value addr_a1 is determined for storing the Xa bits. A different address value ADDR_a is assigned to each piece of N-bit data.

Equation 1 below gives one example of the first arithmetic operation.

$$\text{addr\_}a1 = \text{ADDR\_}a/2 \qquad \text{[Equation 1]}$$

The second determiner 112 has the functionality of determining the location in the ROM 10 as a location for storing the bits other than the Xa bits from the non-compressed code that is received from the compressor 102, provided that the length of the received non-compressed code is more than Xa bits (i.e., special compressed code). The determination is made by performing the second arithmetic operation on ADDR_a, which is the address value indicating the location of the corresponding non-compressed code in the non-compressed block to yield a result value addr_a2. In the ROM 10, the location indicated by the result value addr_a2 is determined for storing the bits other than the Xa bits. Equation 2 below gives one example of the second arithmetic operation.

$$\text{addr\_}a2 = M/2 + \text{Round}_{1/2}(\text{ADDR\_}a/4) \qquad \text{[Equation 2]}$$

Here, M denotes the number of non-compressed codes, which equivalently is the number of compressed codes. Furthermore, $\text{Round}_{1/2}(\text{ADDR\_}a/4)$ is a function that returns a result value obtained by rounding the division result of ADDR_a by 4 to the nearest half.

The controller 110 controls the accessor 101 to write the M compressed codes to the compressed code area 22 of the storage device 20, in accordance with the locations determined by the first and second determiners 111 and 112.

The controller 110 attaches a one-bit flag to the Xa bits (N/2−1 bits, in the above example) of each compressed code. The one-bit flag indicates whether or not the compressed code exceeds Xa bits. The compressed code and the flag are then written to the storage device 20 at the location determined by the first determiner 111.

In the following description, the data composed of Xa bits of a compressed code and a one-bit flag for the compressed code may be collectively referred to as "first data". In addition, the bits other than Xa bits of a compressed code is referred to as "second data" provided that the compressed code is a special compressed code, which has a length exceeding Xa bits.

Upon completion of writing the M compressed codes to the compressed code area 22 by controlling the accessor 101, the controller 110 issues to the write device 30 an instruction to write data to the ROM 10. The write device 30 is a ROM writer in this case.

In response to the write instruction, the write device 30 writes the compressed codes to the ROM 10 while maintaining the relative memory locations as they are in the compressed code area 22 of the storage device 20.

<2-2. Access Device>

Figure 2:
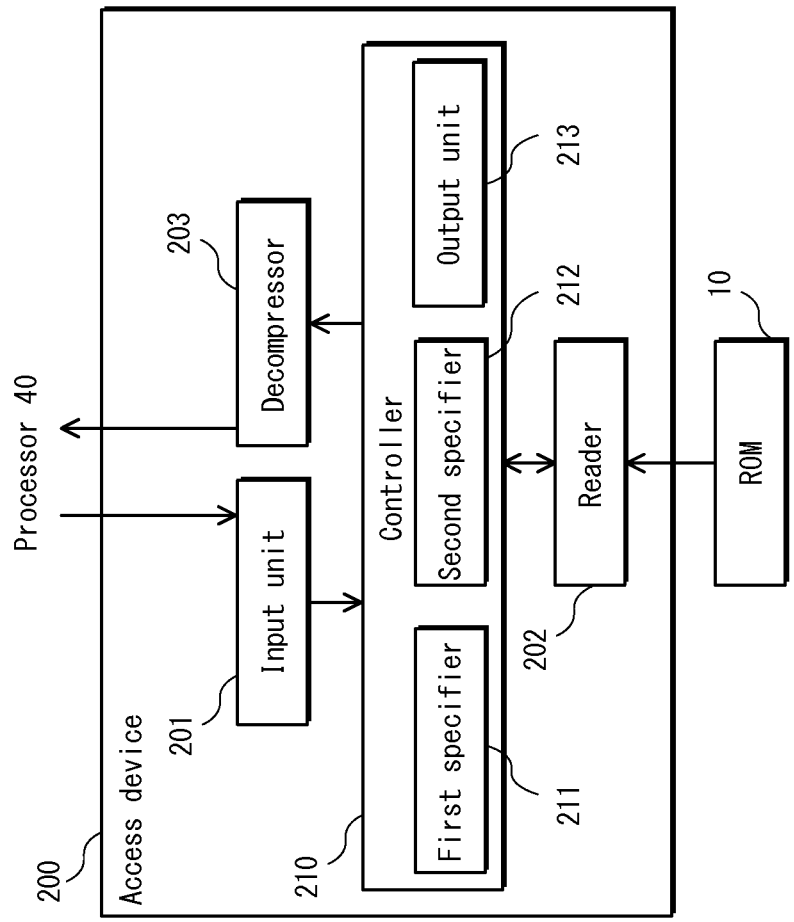
FIG. 2 is a functional block diagram showing important parts of an access device 200 according to Embodiment 1.

FIG. 2 is a functional block diagram showing important parts of the access device 200 according to Embodiment 1.

It is supposed that the ROM 10 stores the compressed codes at the locations determined by the memory location determining device 100.

As shown in the figure, the access device 200 includes an input unit 201, a reader 202, a decompressor 203, and a controller 210. The access device 200 is a computer having a processor (the one different from the processor 40) and a memory. The functionalities of the decompressor 203 and the controller 210 are implemented by the processor executing a program stored on the memory.

The input unit 201 has the functionality of receiving an address value ADDR_b from the processor 40 to send it to the controller 210. The address value ADDR_b is used for accessing a desired non-compressed code.

A different address value ADDR_b is assigned to each piece of N-bit data.

The reader 202 has the functionally of reading first and second data from the ROM 10 to send the read data to the controller 210, under instructions from the controller 210.

The decompressor 203 has the functionality of decompressing a compressed code sent from the controller 210, and sends a resulting non-compressed code to the processor 40.

The controller 210 has the functionality of issuing instructions to the functional blocks of the access device 200 and also has the functionality of controlling the reader 202 to read from the ROM 10 the compressed code corresponding to the non-compressed code desired by the processor 40 (such a compressed code is referred to as a target compressed code) and send it to the decompressor 203. The reading of the compressed code is carried out based on the address value ADDR_b received from the input unit 201.

The controller 210 includes a first specifier 211, a second specifier 212, and an output unit 213.

The first specifier 211 has the functionality of specifying the location in the ROM 10 as the location storing the first data containing Xa bits of the target compressed code. The specification is made according to the result value addr_b1 obtained by performing the first arithmetic operation on the address value ADDR_b received from the input unit 201.

Equation 3 below gives one example of the first arithmetic operation, which is identical to the first arithmetic operation used by the first determiner 111 of the memory location determining device 100 (see Equation 1).

$$\text{addr\_}b1 = \text{ADDR\_}b/2 \qquad \text{[Equation 3]}$$

The first specifier 211 also has the functionality of controlling the reader 202 to read the first data from the specified location in the ROM 10.

The second specifier 212 has the functionality of specifying the location in the ROM 10 as the location where the second data of a special compressed code is stored. The special compressed code refers to a compressed code having a length exceeding Xa bits. The specification of the location is made according to the result value addr_b2 obtained by performing the second arithmetic operation on the address value ADDR_b received from the input unit 201. Note that the second data refers to the bits of the special compressed code other than the Xa bits.

Equation 4 below gives one example of the second arithmetic operation, which is identical to the second arithmetic operation used by the second determiner 112 of the memory location determining device 100 (see Equation 2).

$$\text{addr\_}b2 = M/2 + \text{Round}_{1/2}(\text{ADDR\_}b/4) \qquad \text{[Equation 4]}$$

Here, M denotes the number of non-compressed codes, which equivalently is the number of compressed codes. Furthermore, $\text{Round}_{1/2}(\text{ADDR\_}b/4)$ is a function that returns a value obtained by rounding the division result of ADDR_b by 4 to the nearest half.

The second specifier 212 also has the functionality of controlling the reader 202 to read the second data from the specified location in the ROM 10.

The output unit 213 has the functionality of sending the target compressed code to the decompressor 203. Note that the target compressed code is composed of the Xa bits included in the first data read by the first specifier 211 and the second data read by the second specifier 212.

Note that no second data is read when the length of the target compressed code is Xa bits or less. In that case, the target compressed code composed solely of the compressed code contained in the first data read by the first specifier 211 is sent from the output unit 213 to the decompressor 203.

3. Data

The following describes the data structure of the ROM 10.

Figure 3A:
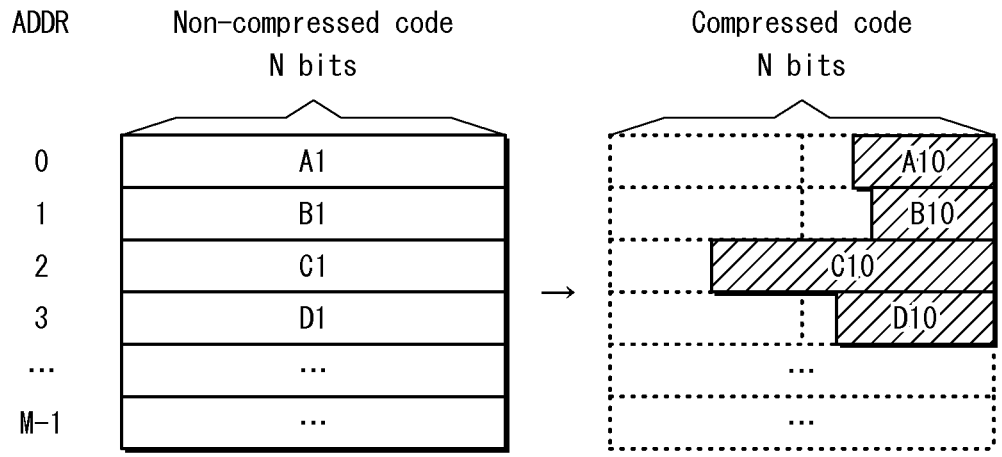
FIG. 3A shows an example of M N-bit non-compressed codes and M compressed codes resulting from the respective non-compressed codes.

FIG. 3A shows an example of M N-bit non-compressed codes and M compressed codes resulting from the respective non-compressed codes.

Figure 9A:
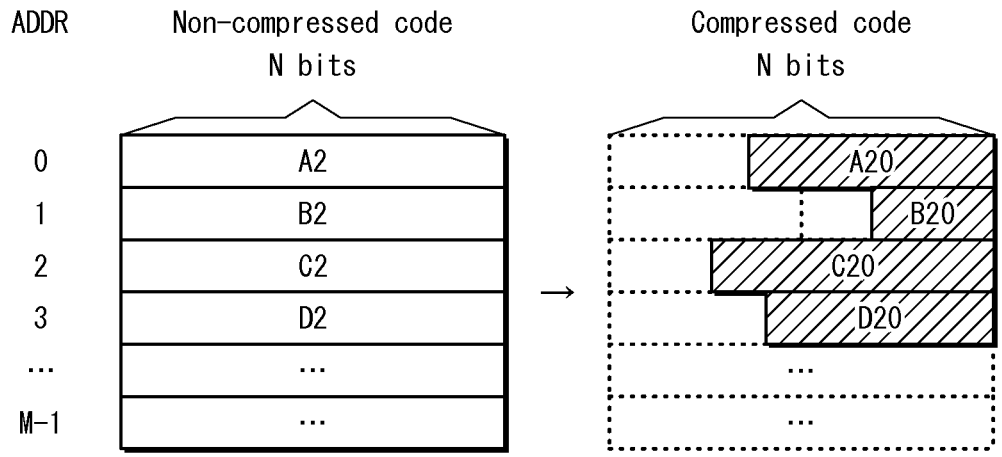
FIG. 9A shows an example of M N-bit non-compressed codes and M compressed codes resulting from the respective non-compressed codes.
Figure 15A:
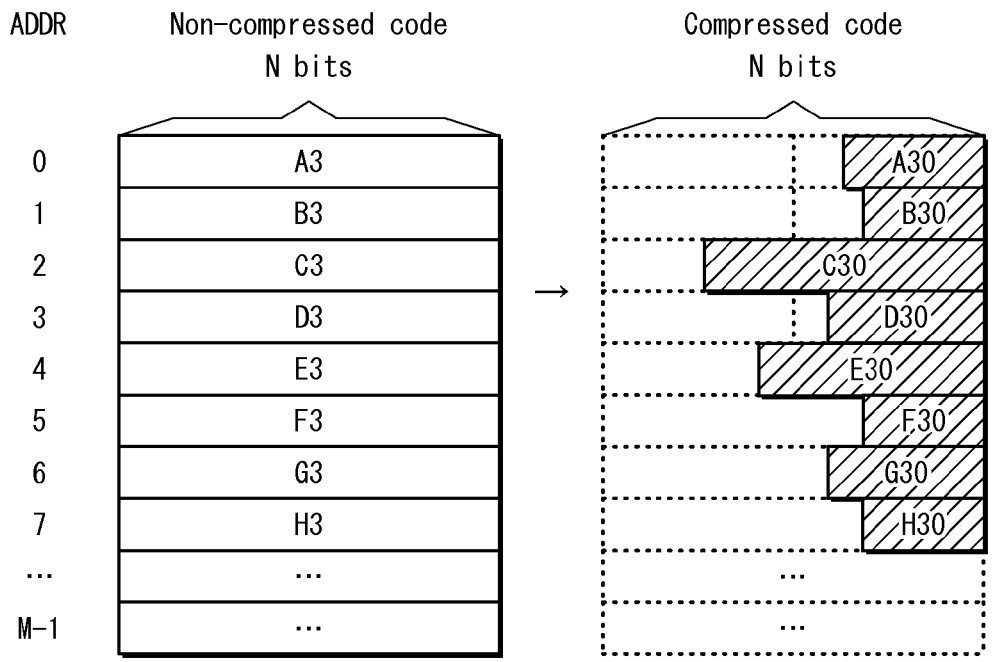
FIG. 15A shows an example of M N-bit non-compressed codes and M compressed codes resulting from the respective non-compressed codes.

In FIG. 3, ADDR denotes the address value ADDR_a of each non-compressed code in a non-compressed block or the address value ADDR_b of a non-compressed code desired by the processor 40 (the same applies to FIGS. 9A and 15A).

For example, the figure shows that the non-compressed code A1 at ADDR 0 is compressed into a code A10.

The figure also shows that the non-compressed codes A1 at ADDR 0, B1 at ADDR 1, and D1 at ADDR 2 are respectively compressed into codes A10, B10, and D10 each having a length of Xa bits or less (N/2−1 bits, in this example). The figure also shows that the non-compressed code C1 at ADDR 2 is compressed into a code C10 having a length exceeding Xa bits (N/2−1 bits in this example).

Figure 3B:
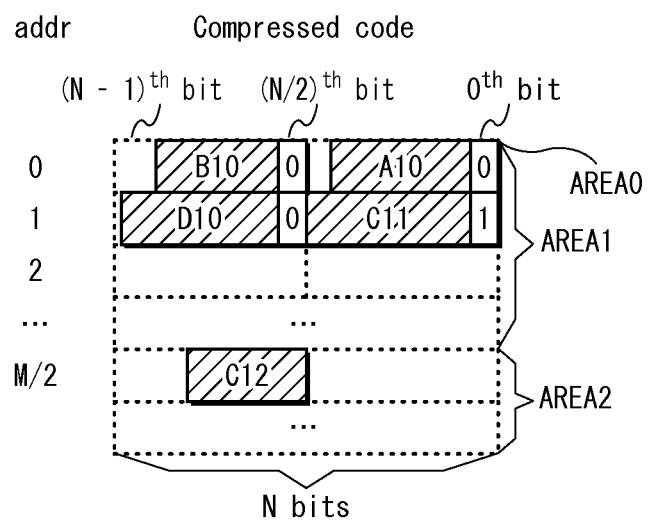
FIG. 3B shows an example of the locations of compressed codes on ROM 10.

FIG. 3B is an example of the locations of the compressed codes (A10-D10) in the ROM 10.

In the figure, AREA0 denotes an area of the ROM 10 for storing the compressed codes. The area AREA0 is divided into a first area AREA1 and a second area AREA2. In the figure, "addr" denotes an address value indicating a location in the ROM 10 (the same applies to FIGS. 9B and 15B).

The first area AREA1 is a physically contiguous area for storing first data of each compressed code. Each piece of first data is composed of Xa bits of a corresponding compressed code and a one-bit flag.

In this example, the flag is set to 0 to indicate that the length of a corresponding compressed code is Xa bits or less, and to 1 to indicate that the length exceeds Xa bits.

The second area AREA2 is a physically contiguous area for storing the second data of each special compressed code, which is a compressed code having a length exceeding Xa bits.

That is, each compressed code having a length of Xa bits or less is stored in the first area AREA1 at the location indicated by the result value addr_a1 of Equation 1. In addition, each special compressed code, which is a code of having a length exceeding Xa bits is divided to be stored at two locations. Namely, one is stored in the first area AREA1 at the location indicated by the result value addr_a1 of Equation 1, and the other in the second area AREA2 at the location indicated by the result value addr_a2 of Equation 2. The method for determining the locations for storing the compressed codes with the use of Equations 1 and 2 is described in detail in the sections <4-1. Location Determination Process> and <4-2. Specific Example of Location Determination Process> under the heading of <4. Operation>.

In the example shown in FIG. 3A, the length of each compressed code A10, B10, and D10 is N/2−1 or less, and the length of the compressed code C10 exceeds N/2−1. Consequently, in this example, only the compressed code C10 has the second data to be stored.

That is, in the example shown in FIG. 3B, the compressed codes A10 and B10 are both placed in the same sub-area at addr 0 in the first area AREA1 of the ROM 10. More specifically, the compressed code A10 is placed at the location corresponding to the higher order N/2 bits of the sub-area, and the compressed code B10 is placed at the location corresponding to the lower order N/2 bits of the sub-area. In addition, data C11 carrying Xa bits of the compressed code C10 is placed in the sub-area at addr 1 in the first area AREA1 of the ROM 10, along with the compressed code D10. More specifically, the data C11 is placed at the location corresponding to the higher order N/2 bits of the sub-area, and the compressed code B10 is placed at the location corresponding to the lower order N/2 bits of the sub-area. In addition, as for the compressed code C10, second data C12 carrying the bits of the compressed code C10 other than the Xa bits is placed in the sub-area at addr M/2 in the second area AREA2 of the ROM 10. More specifically, the second data C12 is placed at the location corresponding to the hither order N/2 bits in the sub-area.

Figure 9B:
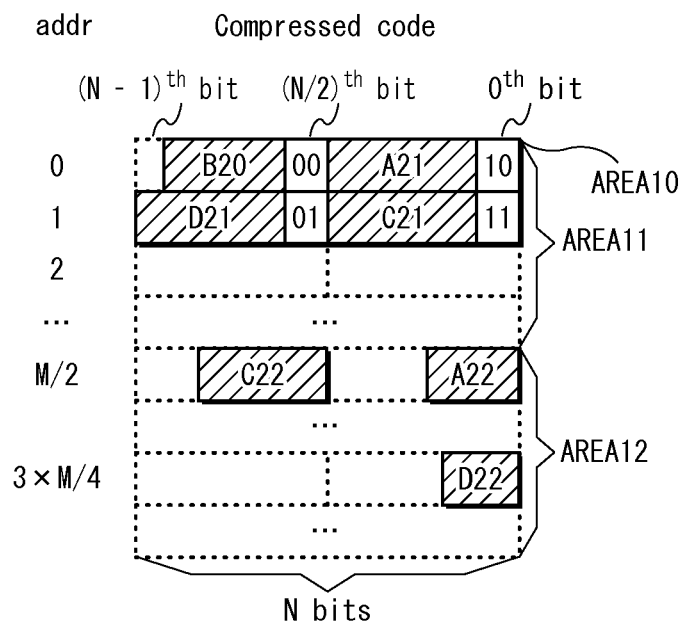
FIG. 9B shows an example of the locations of compressed codes on the ROM 10.
Figure 15B:
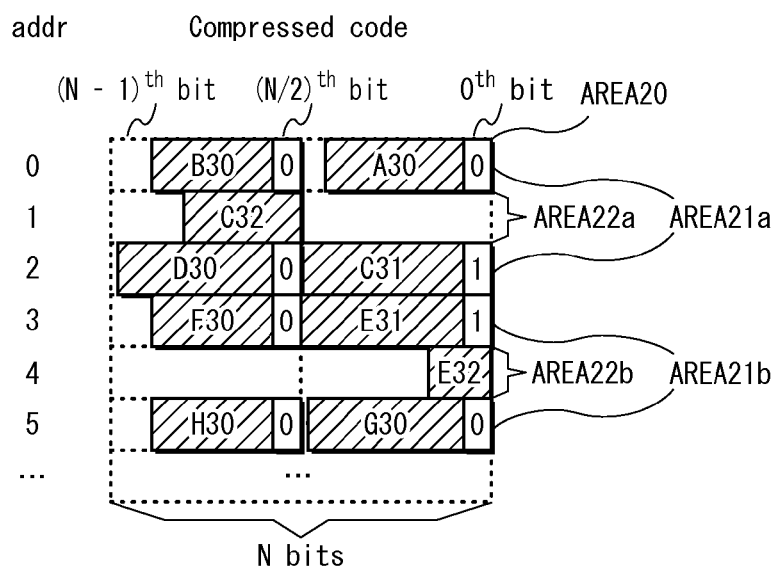
FIG. 15B shows an example of the locations of compressed codes on the ROM 10.

Note that the hatched regions in FIGS. 3A and 3B represent the effective data length of each compressed code (the same applies to FIGS. 9B and 15B). In practice, there is no need to indicate the boundary of the effective data length as long as a non-compressed code of the original fixed length (N bits) is obtained through the decompression by the decompressor 203.

<4. Operation>

The following now describes operation of the memory location determining device 100 and the access device 200 having the above configurations.

<4-1. Memory Location Determining Process>

First of all, a description is given of the memory location determining process performed by the memory location determining device 100.

Figure 4:
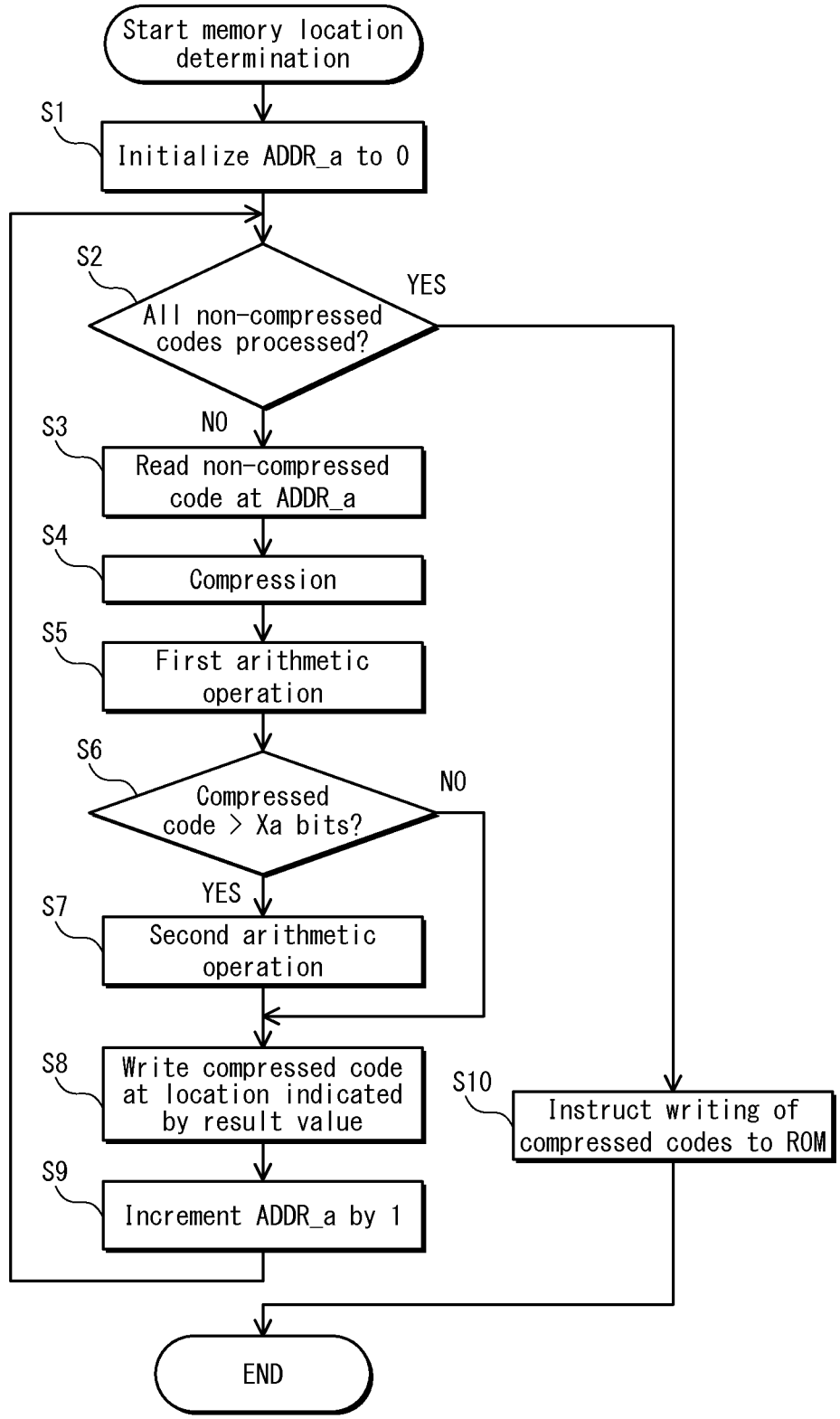
FIG. 4 is a flowchart of a memory location determining process performed by the memory location determining device 100.

FIG. 4 is a flowchart of the memory location determining process performed by the memory location determining device 100.

First, the controller 110 of the memory location determining device 100 initializes the address value ADDR_a (variable) to 0 (Step S1). The address value ADDR_a indicates the address of a target non-compressed code in the non-compressed block.

The controller 110 judges whether or not the series of steps from Step S3 described below has been completed for each of the M non-compressed codes (Step S2).

If the processing from Step S3 has not been completed yet (Step S2: NO), the controller 110 controls the accessor 101 to read the non-compressed code from the storage device 20 (Step S3). The non-compressed code is stored in the non-compressed code area 21 at the location indicated by the address value of ADDR_a.

The controller 110 sends the read non-compressed code to the compressor 102, and the compressor 102 compresses the received non-compressed code and sends the resulting compressed code to the controller 110 along with data-length information indicating the length of the compressed code (Step S4).

The first determiner 111 of the controller 110 performs the first arithmetic operation (see Equation 1) on the address value ADDR_a (Step S5), and the controller 110 judges whether the length indicated by the data-length information received from the compressor 102 is exceeds Xa bits or not (Step S6).

When the length indicated by the data-length information received from the compressor 102 is Xa bits or less (Step S6: NO), the controller 110 controls the accessor 101 to write the compressed code received in Step S4 and a flag in the compressed code area 22 of the storage device 20 at the location indicated by the result value addr_a1 of the first arithmetic operation performed in Step S5 (Step S8). The flag written in Step S8 is set to 0 to indicate that the length of the compressed code is Xa bits or less.

On the other hand, when the length indicated by the data-length information received from the compressor 102 exceeds Xa bits (Step S6: YES), the second determiner 112 of the controller 110 performs the second arithmetic operation on the address value ADDR_a (Step S7).

Subsequently, the controller 110 controls the accessor 101 to write the flag as well as the Xa bits of the compressed code received in Step S4 into the compressed code area 22 of the storage device 20. The location in the compressed code area 22 is indicated by the result value addr_a1 of the first arithmetic operation performed in Step S5. The flag written here is set to 1 to indicate that the length of the compressed code exceeds Xa bits. In addition, the controller 110 controls the accessor 101 to write the bits of the compressed code received in Step S4 other than the Xa bits into the compressed code area 22 at the location indicated by the result value addr_a2 of the second arithmetic operation performed in Step S7 (Step S8).

After completion of Step S8, the controller 110 increments the address value ADDR_a by 1 (Step S9) to repeat the processing from Step S2.

When the processing from Step S3 is completed for each of M non-compressed codes (Step S2: YES), the controller 110 instructs the write device 30 to write the compressed codes held in the compressed code area 22 of the storage device 20 to the ROM 10 (Step S10). This completes the memory location determining process.

In response to the instruction from the controller 110, the write device 30 writes the compressed codes to the ROM 10 without changing the relative locations of the compressed codes as they are in the compressed code area 22.

<4-2. Specific Example of Memory Location Determining Process>

By way of an example shown in FIG. 3, a specific description is given of the memory location determining process performed by the memory location determining device 100 described above, with reference to the flowchart shown in FIG. 4.

(1) Processing on Non-Compressed Code A1

First, the controller 110 of the memory location determining device 100 initializes the address value ADDR_a indicating the address of a target non-compressed code in the non-compressed block to 0 (Step S1).

In this example, the processing from Step S3 has not been completed for all of the M non-compressed codes yet (Step S2: NO). Therefore, the controller 110 controls the accessor 101 to read the non-compressed code (A1) from the location indicated by the address value of ADDR_a (=0) in the non-compressed code area 21 of the storage device 20 (Step S3).

The controller 110 sends the read non-compressed code (A1) to the compressor 102, and the compressor 102 compresses the received non-compressed code (A1) to send the resulting compressed code (A10) to the controller 110 along with data-length information indicating the length of the compressed code (Step S4).

The first determiner 111 of the controller 110 performs the first arithmetic operation (see Equation 1) on the address value ADDR_a (=0) (Step S5). In this case, the result value addr_a1 of the first arithmetic operation is 0 (=ADDR_a/2, where ADDR_a holds the value 0).

In this example, the data-length information received from the compressor 102 indicates the length of Xa bits or less (Step S6:NO). Consequently, the controller 110 controls the accessor 101 to write the flag (=0) and the compressed code (A10) that is received in Step S4 into the compressed code area 22 of the storage device 20 as shown in FIG. 3B (Step S8). More specifically, the flag (=0) and the compressed code (A10) are written into the location indicated by the result value addr_a1 (=0) of the first arithmetic operation performed in Step S5.

The controller 110 increments the address value ADDR_a by 1 to yield a new value 1 (Step S9) and then repeats the processing from Step S2.

(2) Processing on Non-Compressed Code B1

The similar processing is performed on the compressed code B10, which is compressed from the non-compressed code B1 (Steps S2 to S6, S8, and S9).

Therefore, the details thereof are omitted. The result value addr_a1 of the first arithmetic operation performed in Step S5 is ½ (=ADDR_a/2, where ADDR_a holds the value 1). In addition, in the example shown in FIG. 3A, the length of the compressed code B10 is Xa bits or less.

Consequently, the flag (=0) and the compressed code (B10) that is received in Step S4 are written into the compressed code area 22 of the storage device 20. In particular, as shown in FIG. 3B, the flag (=0) and the compressed code (B10) are written into the location indicated by the result value addr_a1 (=½) of the first arithmetic operation.

(3) Processing on Non-Compressed Code C1

In this example, the processing from Step S3 has not been completed for all of the M non-compressed codes yet (Step S2: NO). Therefore, the controller 110 controls the accessor 101 to read the non-compressed code (C1) from the location indicated by the address value of ADDR_a (=2) in the non-compressed code area 21 of the storage device 20 (Step S3).

The controller 110 sends the read non-compressed code (C1) to the compressor 102, and the compressor 102 compresses the received non-compressed code (C1) to send the resulting compressed code (C10) to the controller 110 along with data-length information indicating the length of the compressed code (Step S4).

The first determiner 111 of the controller 110 performs the first arithmetic operation (see Equation 1) on the address value ADDR_a (=2) (Step S5). In this case, the result value addr_a1 of the first arithmetic operation is 1 (=ADDR_a/2, where ADDR_a holds the value 2).

In this example, the data-length information received from the compressor 102 indicates the length that exceeds Xa bits (Step S6: YES). Consequently, the second determiner 112 of the controller 110 performs the second arithmetic operation on the address value ADDR_a (Step S7). In this case, the result value addr_a2 of the second arithmetic operation is $M/2+½$ (=$M/2+\text{Round}_{1/2}(ADDR\_a/4)$, where ADDR_a holds the value 2).

Subsequently, the controller 110 controls the accessor 101 to write the flag (=1) as well as the Xa bits (C11) of the compressed code (C10) received in Step S4 into the compressed code area 22 of the storage device 20. More specifically, the flag (=1) and the Xa bits (C11) are written into the location indicated by the result value addr_a1 (=1) of the first arithmetic operation performed in Step S5. In addition, the controller 110 controls the accessor 101 to write the bits (C12) of the compressed code (C10) other than the Xa bits into the compressed code area 22 at the location indicated by the result value addr_a2 (=M/2+½) of the second arithmetic operation performed in Step S7 (Step S8).

After completion of Step S8, the controller 110 increments the address value ADDR_a by 1 to yield a new value 3 (Step S9) and then repeats the processing from Step S2.

(4) Processing on Non-Compressed Code D1

The similar processing is performed on the compressed code D10, which is compressed from the non-compressed code D1. As a result, as shown in FIG. 3B, the flag (=0) and the compressed code (D10) that is received in Step S4 are written into the compressed code area 22 of the storage device 20 at the location indicated by the result value addr_a1 (3/2) of the first arithmetic operation.

<4-3. Access Process>

Next, a description is given of the access process performed by the access device 200.

Figure 5:
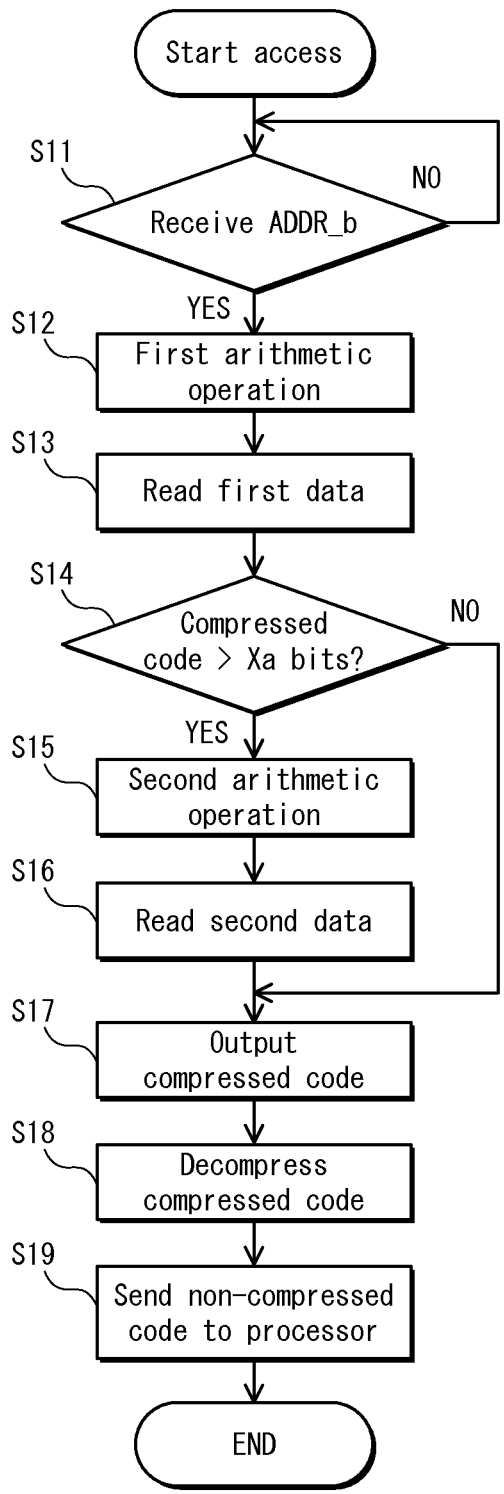
FIG. 5 is a flowchart of an access process performed by the access device 200.

FIG. 5 is a flowchart of an access process performed by the access device 200.

First, the controller 210 of the access device 200 controls the input unit 201 to receive the address value ADDR_b of a desired non-compressed code from the processor 40 (Step S11: YES).

The first specifier 211 of the controller 210 performs the first arithmetic operation (see Equation 3) on the address value ADDR_b (Step S12), and the controller 210 controls the reader 202 to access the ROM 10 to read the first data of a compressed code corresponding to the non-compressed code having the address value ADDR_b from the location in the first area AREA1 indicated by the result value addr_b1 of the first arithmetic operation (Step S13).

With reference to the value of the flag contained in the first data, the controller 210 judges whether the compressed code exceeds Xa bits or not (Step 14).

When the flag is 0, the controller 210 judges that the length of the compressed code is Xa bits or less (Step S14: NO), and the output unit 213 of the controller 210 outputs the compressed code contained in the read first data to the decompressor 203 (Step S17).

On the other hand, when the flag is 1, the controller 210 judges that the length of the compressed code exceeds Xa bits (Step S14: YES), and the second specifier 212 of the controller 210 performs the second arithmetic operation on the address value ADDR_b (Step S15). The controller 210 controls the reader 202 to access the ROM 10 to read the second data from the location in the second area AREA2 indicated by the result value addr_b2 of the second arithmetic operation (Step S16). The output unit 213 of the controller 210 outputs a compressed code that is composed of the Xa bits contained in the read first data and the second data to the decompressor 203 (Step S17).

After completion of Step S17, the decompressor 203 decompresses the received compressed code (Step S18) to send the resulting non-compressed code to the processor (Step S19). This completes the access process.

<4-4. Specific Example of Access Process>

By way of an example shown in FIG. 3, a specific description is given of the access process performed by the access device 200 described above, with reference to the flowchart shown in FIG. 5.

In the following description, it is supposed that the access device 200 receives the value 2 as the address value ADDR_b of the non-compressed code C1 from the processor 40.

The controller 210 of the access device 200 controls the input unit 201 to receive the address value ADDR_b (=2) of the desired non-compressed code (C1) from the processor (Step S11: YES).

The first determiner 211 of the controller 210 performs the first arithmetic operation (see Equation 3) on the address value ADDR_a (=2) (Step S12). Here, the result value addr_b1 of the first arithmetic operation is 1 (=ADDR_b/2, where ADDR_b holds the value 2).

The controller 210 controls the reader 202 to access the ROM 10 to read the first data (the flag (=1) and the data C11) from the location, in the first area AREA1, indicated by the result value addr_b1 (=1) of the first arithmetic operation (Step S13).

In this example, since the flag is 1, the controller 210 judges that the length of the compressed code exceeds Xa bits (Step S14: YES), and the second specifier 212 of the controller 210 performs the second arithmetic operation on the address value ADDR_b (Step S15). Here, the result value addr_b2 of the second arithmetic operation is M/2+½ (=M/2+Round$_{1/2}$(ADDR_b/4, where ADDR_b holds the value 2).

The controller 210 controls the reader 202 to access the ROM 10 to read the second data (C12) from the location, in the second area AREA2, indicated by the result value addr_b2 (=M/2+½) of the second arithmetic operation (Step S16). The output unit 213 of the controller 210 outputs a compressed code that is composed of the Xa bits (C11), which is contained in the read first data, and the second data (C12) to the decompressor 203 (Step S17).

After completion of Step S17, the decompressor 203 decompresses the received compressed code (Step S18) to send the resulting non-compressed code (C1) to the processor 40 (Step S19). This completes the access process.

5. Consideration

The memory location determining device 100 according to Embodiment 1 can determine the locations, in the ROM 10, for storing the compressed codes without using an address translation table. In addition, the memory location determining device 100 according to Embodiment 1 can save the capacity of the area AREA0 of the ROM 10 used to store the compressed codes under a certain condition.

With reference to the two non-compressed code at the address value ADDR_a=2×j and at the ADDR_a=2×j+1 (where j=0, 1 ... M/2), on condition that at least one of compressed codes corresponding to the two non-compressed codes is not a special compressed code, the capacity of the storage area AREA0 (see FIG. 3B) is as follows.

That is, the capacity of the storage area AREA0 is equal to the sum of the capacity of the first area AREA1 (M×N/2 bits) and the capacity of the second area AREA2 (M×N/4 bits), which is calculated to be M×N×¾ bits.

The simplest way to avoid the use of an address translation table may be to simply place the M compressed codes in an N-bit area of the ROM 10 in order in the same relative locations. In this case, the capacity of the storage areas is calculated to be M×N. In comparison, the memory location determining device 100 according to Embodiment 1 can save this capacity by 25%.

Similarly, the access device 200 according to Embodiment 1 can specify the location of a target compressed code by using the predetermined arithmetic operations (the first and second arithmetic operations), without the need to use an address translation table.

<<Modification 1>>

In Embodiment 1, the access device 200 is provided with a processor and a memory storing a program, and the functionality of the controller 210 is implemented by the processor executing the program. Alternatively, in the following modification, the functionality of the controller 210 is implemented by relatively simple circuitry.

Figure 6:
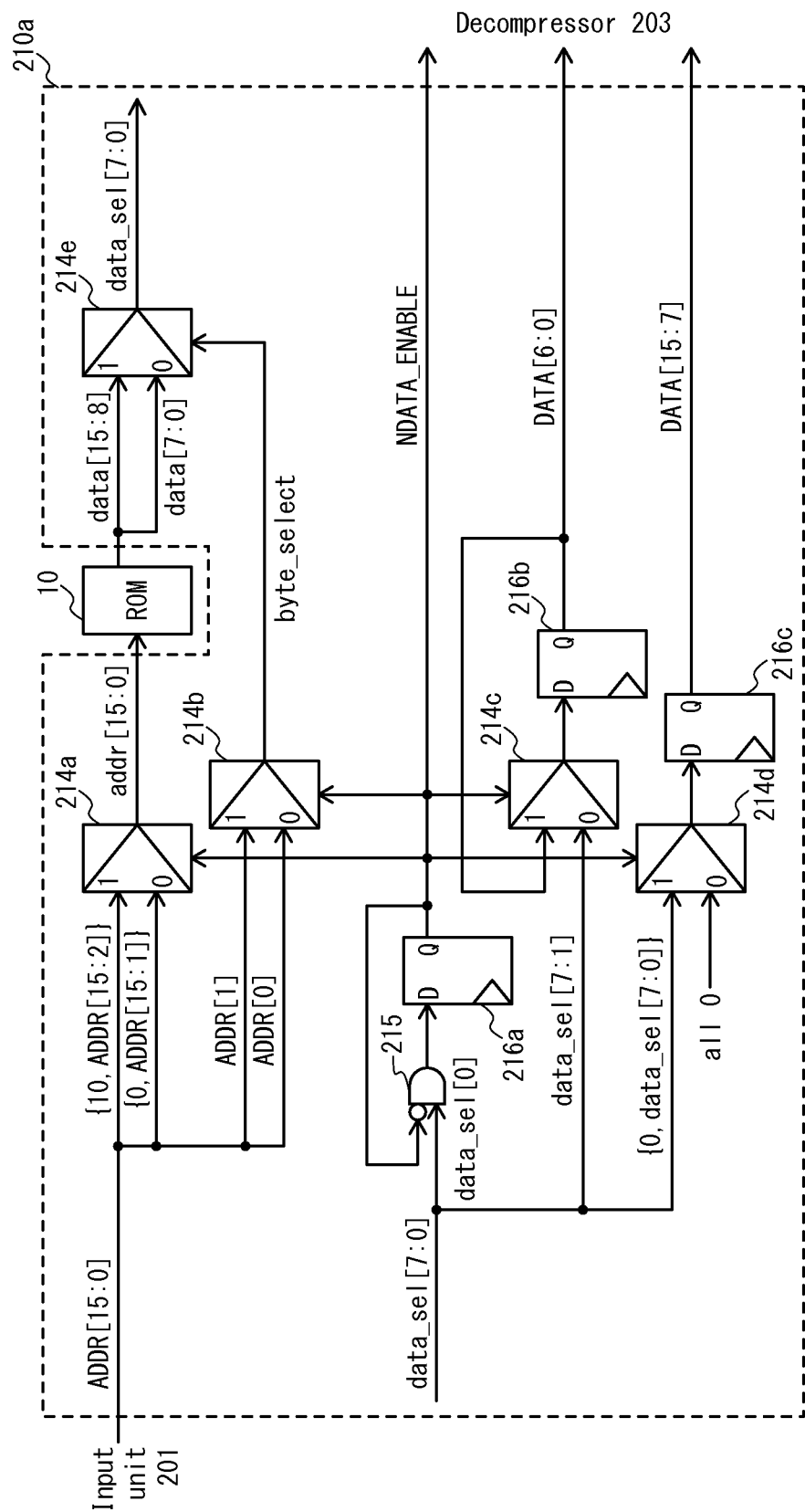
FIG. 6 is a view showing the circuit configuration of a control circuit 210a of an access device according to Modification 1.

FIG. 6 shows the circuit configuration of a control circuit 210a of an access device according to Modification 1.

In the figure, the address value received from the processor 40 via the input unit 201 is designated "ADDR", and the address value forwarded to the ROM 10 by the reader 202 is designated "addr". Each address value ADDR and addr is a 16-bit value. In the example shown in the figure, in addition, N is 16 bits, and the ROM 10 outputs 16-bit data in response to the 16-bit address value addr. The same applies to Modification 2, which will be described later.

As shown in the figure, the control circuit 210a of the access device according to Modification 1 includes selectors 214a-214e, an AND circuit 215, and D flip-flops 216a-216c. The control circuit 210a outputs DATA one or two cycles after the input of the address value ADDR from the processor 40, provided that NDATA_ENABLE, which will be described later, is holds the value 0. The decompressor 203 acquires and decompresses the DATA as an effective compressed code.

Each of the selectors 214a-214d has two inputs 0 and 1 and selects one of the inputs that is equal to the value of NDATA_ENABLE. Similarly, the selector 214e selects one of the inputs that is equal to the value of byte_select, which will be described later.

Suppose that each of the selectors 214a-214e is connected to select the input 0 at the time of input of the address value ADDR from the processor 40 via the input unit 201.

The following is a specific example of the operation of the control circuit 210a performed in response to an input of the address value ADDR from the processor 40. In this example, the address value ADDR is the address value (=2) of the non-compressed code C1 shown in FIG. 3A.

(1) Reading of First Data

At the time when the 16-bit address value ADDR [15:0], which is bits 0 to 15='0 . . . 010'b=2, is input from the processor 40 via the input unit 201, the selector 214a is connected to select the input 0.

Consequently, the selector 214a outputs the 16-bit address value composed of ADDR [15:1] (bits 1 to 15 of the address value) and 0 as its most significant bit. That is, the address value {0,ADDR[15:1]}='0 . . . 001'b=1 is output as addr [15:0].

In response to the input of addr [15:0], the ROM 10 outputs data [15:8] and data [7:0], which are respectively the higher order 8 bits and the lower order 8 bits of the 16-bit data held at addr (=1) shown in FIG. 3B.

In the example shown in FIG. 3B, data [15:8] is 8-bit data composed of the flag (=0) and the compressed codeD10, whereas data [7:0] is 8-bit data that includes the flag (=1) and the compressed code C11.

The selector 214b is connected to select the input 0. Consequently, the selector 214b outputs, as byte_select, bit 0 of the address value ADDR (ADDR[0]='0'b) received from the processor 40.

The selector 214e thus outputs data_sel[7:0], which in this case is data[7:0] (including C11).

In this example, bit 0 of data_sel[7:0] (i.e., data_sel[0]) is the flag set to 1, and thus NDATA_ENABLE holds the value 0. Consequently, the AND circuit 215 outputs the value 1 to the D flip-flop 216a.

In addition, the selector 214c is connected to select the input 0. The selector 214c thus outputs data_sel [7:1], which are bits 1-7 of data_sel [7:0], to the D flip-flop 216b.

In addition, the selector 214d is connected to select the input 0. The selector 214d thus outputs all 0s (a sequence of 9 bits all holding the value 0) to the D flip-flop 216c.

Upon input of a clock pulse to the D flip-flops 216a-216c, the D flip-flop 216a outputs NDATA_ENABLE holds the value 1, and the D flip-flop 216b outputs data_sel[7:1] (C11) as DATA[6:0]. The D flip-flop 216c outputs all 0s (a sequence of 9 bits all holding the value 0) as DATA [15:7].

In this example, at the point in time (i.e., one cycle after the input of address value ADDR from the processor 40), the value of NDATA_ENABLE is 1 and thus the decompressor 203 does not decompress DATA yet.

(2) Reading of Second Data

As described above, NDATA_ENABLE now holds the value 1 and thus the selectors 214a-214d are each connected to select the input 1.

Consequently, the selector 214a outputs the 16-bit address value composed of ADDR [15:2] (bit 2 to bit 15 of the address value ADDR received from the processor 40) and "10" as its higher order 2 bits. That is, the address value {10,ADDR[15:2]}='10 . . . 0'b=$2^{15}$ is output as addr [15:0].

In response to the input of addr [15:0], the ROM 10 outputs data [15:8] and data [7:0], which are respectively the higher order 8 bits and the lower order 8 bits of the 16-bit data held at addr (M/2) shown in FIG. 3B.

Consequently, the selector 214b outputs ADDR [1]='1'b (bit 1 of the address value ADDR received from the processor 40) as byte_select.

The selector 214e thus outputs data_sel[7:0], which in this case is data[15:8] (including C12).

At this stage, NDATA_ENABLE holds the value 1 and thus the AND circuit 215 outputs 0 to the D flip-flop 216a. The selector 214c outputs DATA [6:0] (i.e., C11, which is composed of 7 bits of the compressed code C10) to the D flip-flop 216b. The selector 214d outputs 9-bit data composed of data_sel [7:0] (including C12) and 0 as its most significant bit to the D flip-flop 216c.

Upon input of a clock pulse to the D flip-flops 216a-216c, the D flip-flop 216a outputs NDATA_ENABLE holding the value 0, and the D flip-flop 216b outputs DATA[6:0] (i.e., C11, which is composed of 7 bits of the compressed code C10). The D flip-flop 216c outputs DATA[15:7] (i.e., C12, which is composed of the bits of the compressed code C10 other than C11).

In this example, at this point in time (i.e., two cycles after the input of address value ADDR from the processor 40), NDATA_ENABLE holds the value 0. Therefore, the decompressor 203 acquires DATA (DATA [6:0] and DATA[15:7]) output from the control circuit 210a and decompress the acquired data.

Embodiment 2

The following describes an embodiment in which the second arithmetic operation described in Embodiment 1 is modified, with particular emphasis on the difference with Embodiment 1.

<1. Configuration>

Figure 7:
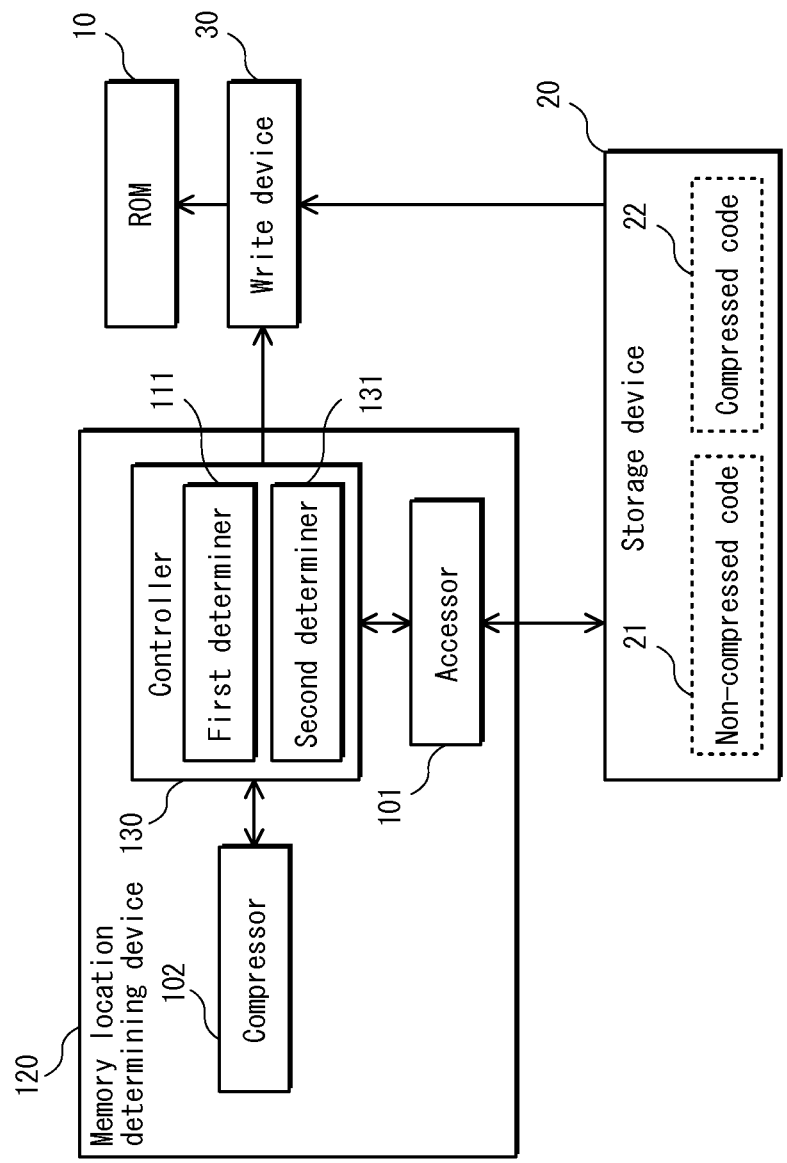
FIG. 7 is a functional block diagram showing important parts of a memory location determining device 120 according to Embodiment 2.
Figure 8:
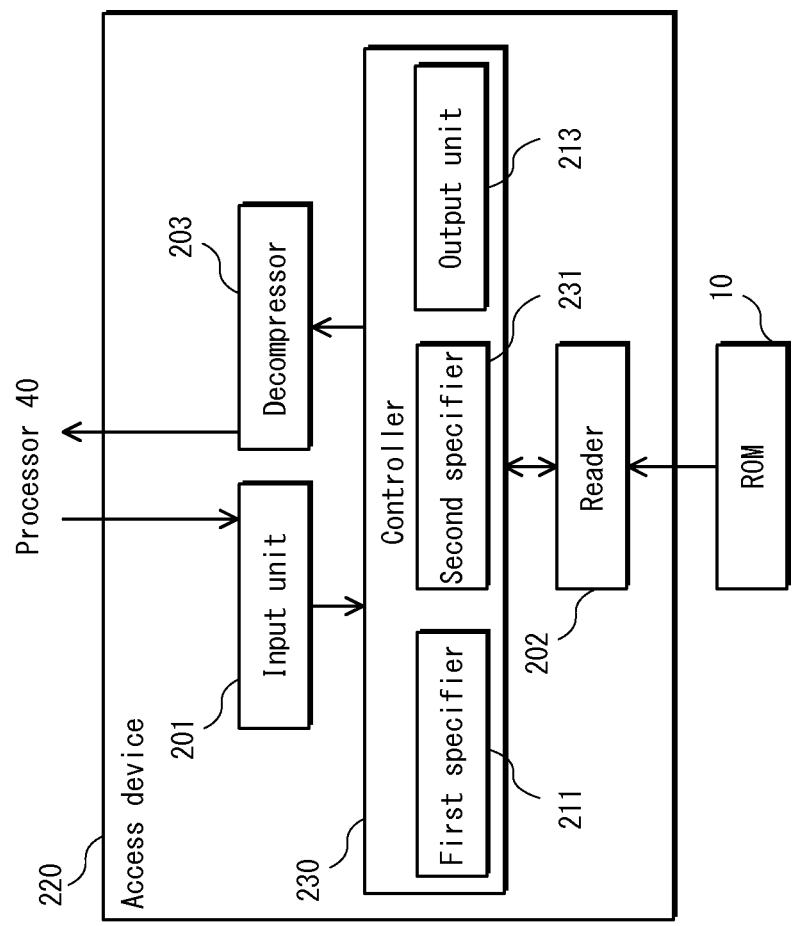
FIG. 8 is a functional block diagram showing important parts of an access device 220 according to Embodiment 2.

FIG. 7 is a functional block diagram showing important parts of a memory location determining device 120 according to Embodiment 2. FIG. 8 is a functional block diagram showing important parts of an access device 220 according to Embodiment 2.

As shown in FIG. 7, the memory location determining device 120 differs from the memory location determining device 100 in that a controller 130 is included instead of the controller 110. In addition, the controller 130 differs from the controller 110 of Embodiment 1 in that a second determiner 131 is included instead of the second determiner 112.

As shown in FIG. 8, the access device 220 differs from the access device 200 according to Embodiment 1 in that a controller 230 is included instead of the controller 210. The controller 230 differs from the controller 210 according to Embodiment 1 in that a second specifier 231 is included instead of the second specifier 212.

More specifically, the second determiner 131 of the memory location determining device 120 and the second specifier 231 of the access device 220 differ from the second determiner 112 and the second specifier 212, respectively, in that one of the arithmetic operations given by Equations 6-8 is performed as the second arithmetic operation on the address value ADDR_a and ADDR_b expressed by Equation 5.

$$ADDR\_a = ADDR\_b = 4 \times j + k \qquad \text{[Equation 5]}$$

where $j=0, 1, \ldots, M/4-1$, $k=0, 1, 2, 3$.

$$addr\_a2 = addr\_b2 = M/2 + j \qquad \text{[Equation 6]}$$

$$addr\_a2 = addr\_b2 = M/2 + j + \frac{1}{2} \qquad \text{[Equation 7]}$$

$$addr\_a2 = addr\_b2 = 3 \times M/4 + j/2 \qquad \text{[Equation 8]}$$

<2. Data>

FIG. 9A shows an example of M N-bit non-compressed codes and M compressed codes resulting from the respective non-compressed codes.

In FIG. 9A, non-compressed codes A2-D2 respectively at ADDR 0-3 are compressed into codes A20-D20. The compressed codes A20, C20, and D20 each have a length exceeding N/2−2 bits.

In addition, FIG. 9B is an example of the locations of the compressed codes (A20-D20) on the ROM 10.

An area of the ROM 10 designated by AREA10 is used to store the compressed codes, and this area is divided into a first area AREA11 and a second areaAREA12.

Similarly to the first area AREA1 of the Embodiment 1, the first area AREA11 is for storing first data of each compressed code. Yet, the first area AREA11 differs from the first area AREA1 in that each piece of first data is composed of Xb bits of a corresponding compressed code (where Xb<N, and Xb in this example is equal to N/2−2=6 bits) and a two-bit flag.

The 2-bit flag indicates whether a corresponding compressed code exceeds Xb bits or not and also indicates one of Equations 6-8. The indicated equation is used to determine the location for storing the bits of the compressed code other than the Xb bits.

In this example, the 2-bit flag is set to 00 for a compressed code having a length of Xb bits or less. For a compressed code exceeding Xb bits, the 2-bit flag is set to one of the following values. That is, the 2-bit flag is set to 10 to indicate that Equation 6 is used, to 11 to indicate that Equation 7 is used, and to 01 to indicate that Equation 8 is used.

Similarly to the second area AREA2 according to Embodiment 1, the second area AREA12 is used to store the second data of each special compressed code, which is a compressed code having a length exceeding Xb bits. While a special compressed code according to Embodiment 1 refers to a compressed code having a length exceeding Xa bits, a special compressed code according to Embodiment 2 refers to a compressed code having a length exceeding Xb bits.

In the example shown in FIG. 9A, the length of each of compressed codes A20, C20, and D20 exceeds N/2−2 bits, and the length of the compressed code B20 is N/2−2 or less.

Thus, as shown in FIG. 9B, the compressed codes A20, C20, and D20 are each stored partly in the first area AREA11 and partly in the second area AREA12 of the ROM 10. The method for determining the locations for storing compressed codes using Equations 68 is described in detail in the sections <3-1. Location Determination Process> and <3-2. Specific Example of Location Determination Process> under the heading of <3. Operation>.

<3. Operation>

The following now describes operation of the memory location determining device 120 and the access device 220.

<3-1. Memory Location Determining Process>

First of all, a description is given of the memory location determining process performed by the memory location determining device 120.

Figure 10:
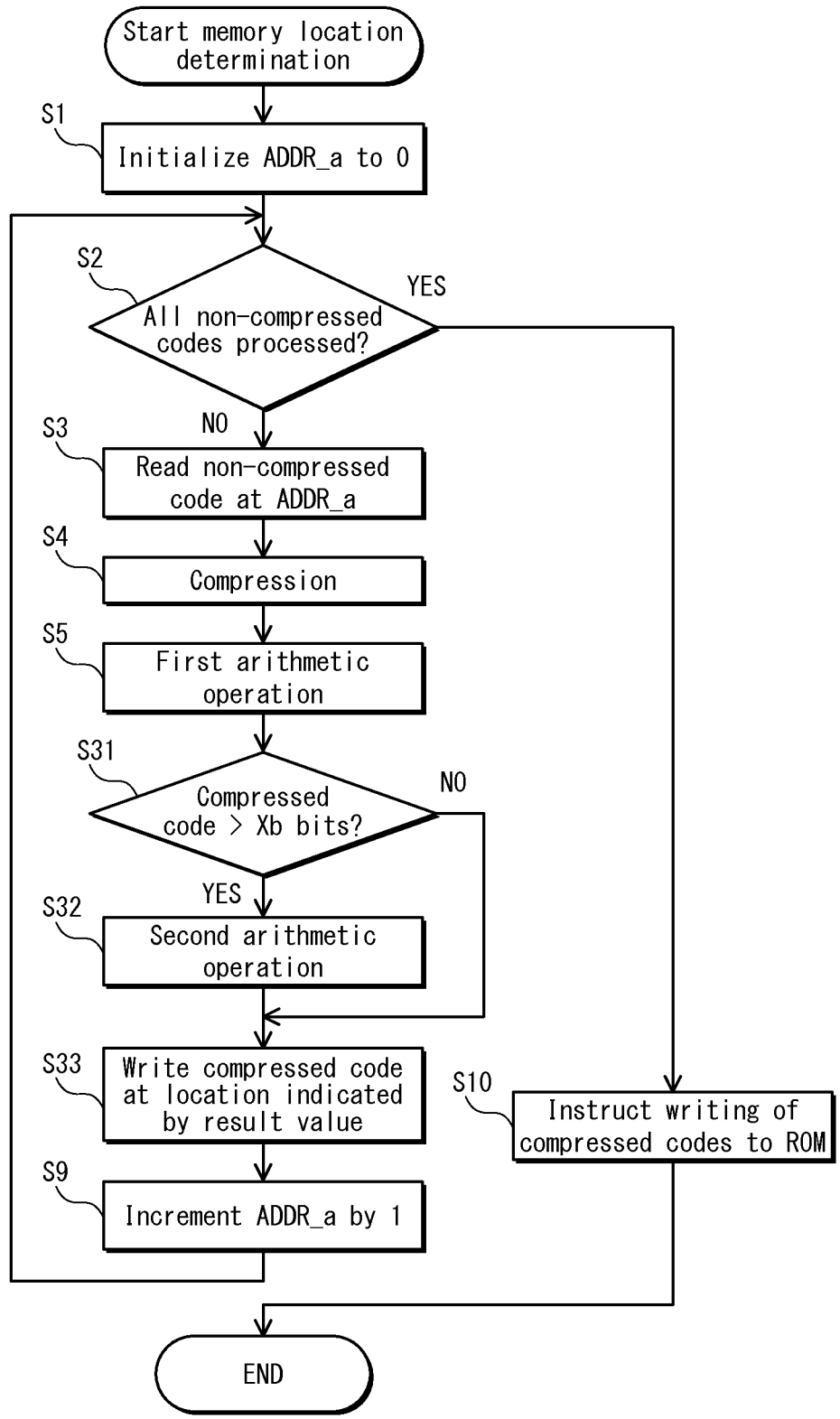
FIG. 10 is a flowchart of a memory location determining process performed by the memory location determining device 120.

FIG. 10 is a flowchart of the memory location determining process performed by the memory location determining device 120.

As shown in the figure, the memory location determining process performed by the memory location determining device 120 differs from that performed by the memory location determining device 100 according to Embodiment 1 and shown in FIG. 4 in that Steps S31-S33 are included instead of Steps S6-S8. Therefore, the following description is given with particular emphasis on Steps S31-S33.

After completing Steps S1-S5, the controller 130 judges whether the data-length information received from the compressor 102 in Step S4 indicates a length exceeding Xb bits (which is equal to N/2−2, in this example) or not (Step S31).

In Step S6 shown in FIG. 4, the data length is compared against Xa bits (N/2−1 bits). In Step S31, however, the data length is compared against Xb bits (N/2−2 bits) because the flag included in the first data according to Embodiment 2 is composed of 2 bits.

When the data-length information received from the compressor 102 indicates a length that is equal to Xb bits or less (Step S31: NO), the controller 130 controls the accessor 101 to write the 2-bit flag and the compressed code that is received in Step S4 in the non-compressed code area 21 of the storage device 20 at the location indicated by the result value addr_a1 of the first arithmetic operation performed in Step S5 (Step S33). The flag written in this step is set to 00 to indicate that the length of the compressed code is Xb bits or less.

On the other hand, when the length indicated by the data-length information received from the compressor 102 exceeds Xb bits (Step S31: YES), the second determiner 131 of the controller 130 performs the second arithmetic operation on the address value ADDR_a (Step S32).

In particular, four consecutive address values ADDR_a, namely 4×j, 4×j+1, 4×j+2, and 4×j+3 with the value of j common among them (where j=0, 1, . . . M/4−1) are taken as a set. Then, each of Equations 6-8 is performed on a different one of the address values in the same set. In this example, Equations 6, 7, and 8 are sequentially selected in order. The details are given under the heading of <3-2. Specific Example of Memory Location Determining Process>.

Subsequently, the controller 130 controls the accessor 101 to write the 2-bit flag as well as the Xb bits of the compressed code received in Step S4 into the compressed code area 22 of the storage device 20 at the location indicated by the result value addr_a1 of the first arithmetic operation performed in Step S5. The flag written in this step is set to the value depending on which of Equations 6-8 is used in Step S32. That is, the 2-bit flag is set to 10 to indicate that Equation 6 is used, to 11 to indicate that Equation 7 is used, and to 01 to indicate that Equation 8 is used.

In addition, the controller 130 controls the accessor 101 to write the bits of the compressed code other than the Xb bits into the compressed code area 22 at the location indicated by the result value addr_a2 of the second arithmetic operation performed in Step S32 (Step S33). Then, the processing moves onto Step S9.

<3-2. Specific Example of Memory Location Determining Process>

By way of an example shown in FIG. 9, a specific description is given of Steps S31-S33 of the memory location determining process performed by the memory location determining device 120 described above, with reference to the flowchart shown in FIG. 10.

(1) Processing on Non-Compressed Code A2

In this example, the compressed code A20 resulting from the non-compressed code A2 has a length exceeding Xb bits (StepS31: YES) and the address value ADDR_a of the non-compressed code A2 is 4×j (where j=0). The second determiner 131 of the controller 130 thus carries out Equation 6 as the second arithmetic operation (Step S32). The result value addr_a2 of the second arithmetic operation in this case is M/2.

Subsequently, as shown in FIG. 9B, the controller 130 controls the accessor 101 to write the 2-bit flag (=10) as well as the Xb bits (A21) of the compressed code (A20) received in Step S4 into the compressed code area 22 of the storage device 20 at the location indicated by the result value addr_a1 (=0) of the first arithmetic operation performed in Step S5. Also as shown in FIG. 9B, the controller 130 further controls the accessor 101 to write the bits (A22) other than the Xb bits of the compressed code (A20) in the compressed code area 22 at the location indicated by the result value addr_a2 (=M/2) of the second arithmetic operation performed in Step S32 (Step S33).

(2) Processing on Non-Compressed Code B2

In this example, the compressed code B20 resulting from the non-compressed code B2 has a length that is Xb bits or less (Step S31: NO). As shown in FIG. 9B, the controller 130 controls the accessor 101 to write the 2-bit flag (=00) as well as the compressed code received in Step S4 into the compressed code area 22 of the storage device 20 at the location indicated by the result value addr_a1 (=½) of the first arithmetic operation performed in Step S5 (Step S33).

(3) Processing on Non-Compressed Code C2

The compressed code C20 resulting from the non-compressed code C2 is processed in a similar manner as the compressed code A20 (Steps S2-S5, S31-S33, and S9). Therefore, the details thereof are omitted. The result value addr_a1 of the first arithmetic operation performed for the compressed code C20 in Step S5 is 1.

In Step S32, Equation 7 is carried out as the second arithmetic operation to yield the result value addr_a2=M/2+½. In this step, Equation 7 is used because Equation 6 has already been used for the compressed code A20 that belongs to the same set as the compressed code C20 that is currently processed.

Subsequently, as shown in FIG. 9B, the controller 130 controls the accessor 101 to write the 2-bit flag (=11) as well as the Xb bits (C21) of the compressed code (C20) received in Step S4 into the compressed code area 22 of the storage device 20 at the location indicated by the result value addr_a1 (=1) of the first arithmetic operation performed in Step S5. Also as shown in FIG. 9B, the controller 130 further controls the accessor 101 to write the bits (C22) other than the Xb bits of the compressed code (C20) in the compressed code area 22 at the location indicated by the result value addr_a2 (=M/2+½) of the second arithmetic operation performed in Step S32 (Step S33).

(4) Processing on Non-Compressed Code D2

The compressed code D20 resulting from the non-compressed code D2 is also processed in a manner similar to the compressed code A20 above. The first arithmetic operation performed in Step S5 yields the result value addr_a1=⅜.

In Step S32, Equation 8 is carried out as the second arithmetic operation to yield the result value addr_a2=3×M/4.

Subsequently, the controller 130 controls the accessor 101 to write the 2-bit flag (=01) as well as Xb bits (D21) of the compressed code (D20) received in Step S4 into the compressed code area 22 of the storage device 20 at the location indicated by the result value addr_a1 (=⅜) of the first arithmetic operation performed in Step S5. As also shown in FIG. 9B, the controller 130 further controls the accessor 101 to write the bits (D22) other than the Xb bits of the compressed code (D20) in the compressed code area 22 at the location indicated by result value addr_a2 (=3×M/4) of the second arithmetic operation performed in Step S32 (Step S33).

<3-3. Access Process>

Next, a description is given of the access process performed by the access device 220.

Figure 11:
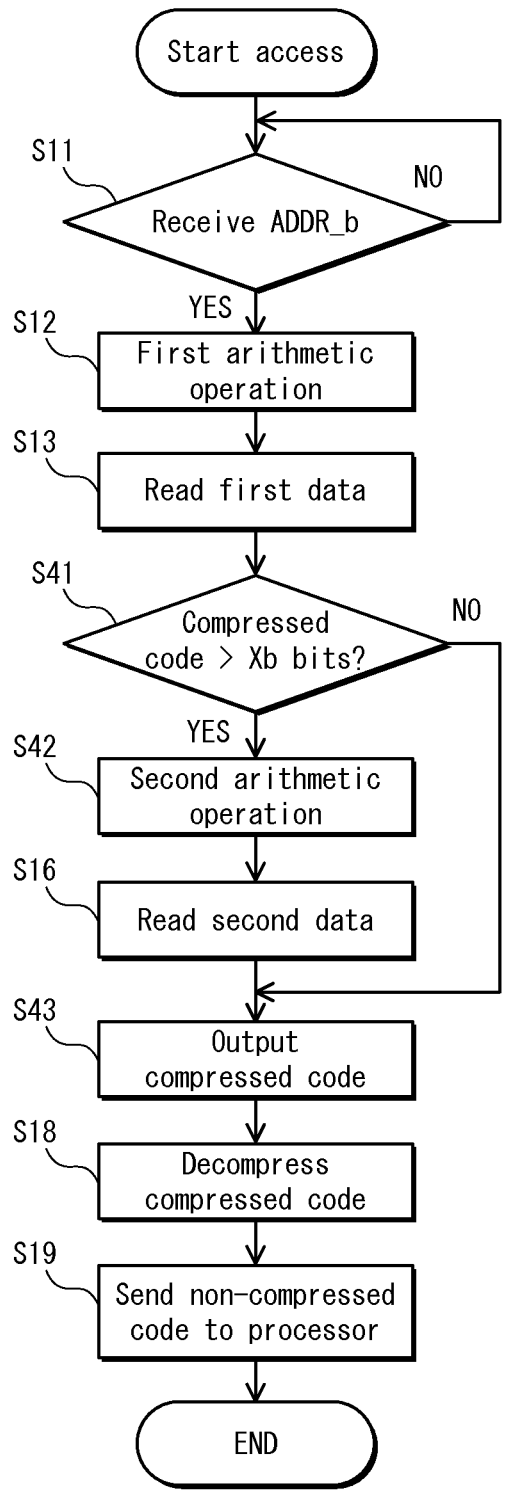
FIG. 11 is a flowchart of an access process performed by the access device 220.

FIG. 11 is a flowchart of the access process performed by the access device 220.

As shown in the figure, the access process performed by the access device 220 differs from that performed by the access device 200 according to Embodiment 1 and shown in FIG. 5 in that Steps S41-S43 are included instead of Steps S14, S15, and S17. Therefore, the following description is given with particular emphasis on Steps S41-S43.

After completion of Steps S11-S13, the controller 230 judges whether the length of the compressed code exceeds Xb bits, with reference to the value of the 2-bit flag included in the first data read in Step S13 (Step S41).

When the flag is set to 00, the controller 230 judges that the length of the compressed code is Xb bits or less (Step S41: NO) and the output unit 213 of the controller 230 outputs the compressed code included in the read first data to the decompressor 203 (Step S43). After completion of Step S43, the access device 220 moves onto Step S18.

On the other hand, when the flag is set to the value other than 00, the controller 230 judges that the length of the compressed code exceeds Xa bits (Step S41: YES), and the second specifier 231 of the controller 230 performs the second arithmetic operation on the address value ADDR_b (Step S42). More specifically, the second specifier 231 performs one of Equations 6-8 corresponding to the value of the flag, on the address value ADDR_b expressed in Equation 5.

That is, Equation 6 is used when the flag is set to 10, and Equation 7 is used when the flag is set to 11, and Equation 8 is used when the flag is et to 01.

The controller 230 controls the reader 202 to access the ROM 10 to read the second data from the location in the second area AREA12 indicated by the result value addr_b2 of the second arithmetic operation (Step S16). The output unit 213 of the controller 230 outputs a compressed code that is composed of Xb bits of the compressed code contained in the read first data and the second data to the decompressor 203 (Step S43). After completion of Step S43, the access device 220 moves onto Step S18.

<3-4. Specific Example of Access Process>

By way of an example shown in FIG. 9, a specific description is given of Steps S41-S43 of the access process performed by the access device 200 described above, with reference to the flowchart shown in FIG. 11.

In the following description, it is supposed that the access device 220 receives the value 3 as the address value ADDR_b of the non-compressed code D2 from the processor 40.

In this example, the flag contained in the first data read in Step S13 is set to 01. The controller 230 thus judges that the length of the compressed code exceeds Xb bits (Step S41: YES).

The second specifier 231 of the controller 230 performs the second arithmetic operation, which is one of Equations 6-8 corresponding to the value of the flag, on the address value ADDR_b expressed in Equation 5 (Step S42). In this example, the address value ADDR_b of the non-compressed code D2 is $4 \times j+3$, where $j=0$, and the flag is set to 01. Therefore, Equation 8 is carried out as the second arithmetic operation to yield the result value $addr\_b2=3 \times M/4$.

The controller 230 controls the reader 202 to access the ROM 10 to read the second data (D21) from the location in the second area AREA12 indicated by the result value addr_b2 ($3 \times M/4$) of the second arithmetic operation (Step S16). The output unit 213 of the controller 230 outputs a compressed code that is composed of the bits (D21) of the first data other than the flag and the second data (D22) to the decompressor 203 (Step S43).

<4. Consideration>

In comparison with the memory location determining device 100 according to Embodiment 1, the memory location determining device 120 according to Embodiment 2 can save more capacity of the memory area AREA10 of the ROM 10 used to store compressed codes, while relaxing the requirements regarding special compressed codes.

Suppose that four consecutive address values ADDR_a of non-compressed codes, namely $4 \times j$, $4 \times j+1$, $4 \times j+2$, and $4 \times j+3$, where $j=0, 1, \ldots M/4-1$ are taken as a set. Then, on condition that at least one of four compressed codes resulting from the four non-compressed codes is not a special compressed code, the required capacity for the area AREA10 (see FIG. 9B) of the ROM 10 for storing the four compressed codes is computed as follows.

That is, the capacity of the storage area AREA10 is equal to the sum of the capacity of the first area AREA11 ($=M \times N/2$ bits) and the capacity of the second area AREA12 ($=M \times N/4$ bits+$M \times N/8$ bits). That is, the sum is equal to $7 \times M \times N/8$ bits.

As described above, the memory location determining device 100 according to Embodiment 1 can save 25% of the capacity, on condition that at least one of two compressed codes resulting from two non-compressed codes having the consecutive address values of ADDR_a is not a special compressed code.

The memory location determining device 120 according to Embodiment 2 can save 12.5% of the capacity, on condition that at least one of four compressed codes resulting from four non-compressed codes having the consecutive address values ADDR_a is not a special compressed code.

<<Modification 2>>

The following describes a modification of Embodiment 2 to implement the controller 230 of the access device 220 with relatively simple circuitry.

Figure 12:
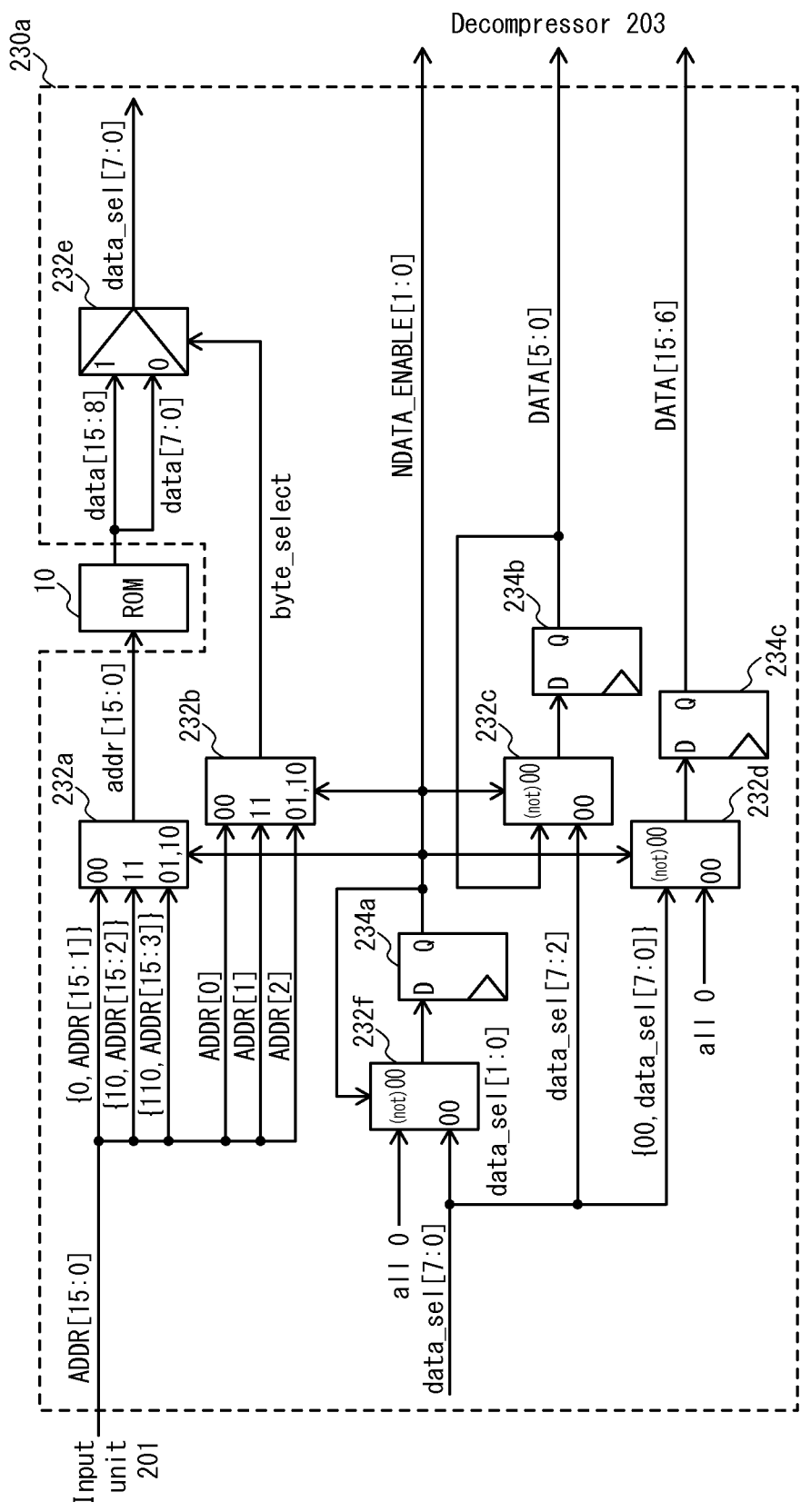
FIG. 12 is a view showing the circuit configuration of a control circuit 230a of an access device according to Modification 2.

FIG. 12 shows the circuit configuration of a control circuit 210a of an access device according to Modification 2.

As shown in the figure, the control circuit 230a of the access device according to Modification 2 includes selectors 232a-232f and D flip-flops 234a-234c.

The control circuit 230a outputs DATA one or two cycles after the address value ADDR is input from the processor 40, provided that NDATA_ENABLE[1:0] holds the value 00. The decompressor 203 acquires DATA as an effective compressed code and decompress it.

Each of the selectors 232a and 232b has three inputs, namely, 00, 11, and one of 01 or 10, and selects the input that is equal to the value of NDATA_ENABLE[1:0].

Suppose that each of the selectors 232a-232f is connected to select the input 00 at the time of input of the address value ADDR from the processor 40 via the input unit 201.

The following is a specific example of the operation of the control circuit 230a performed in response to the input of the address value (=3) of the non-compressed code D2 shown in FIG. 9A from the processor 40.

(1) Reading of First Data

At the time when the address value ADDR[15:0]='0 . . . 011'b=3 is input from the processor 40 via the input unit 201, the selector 232a is connected to select the input 00. Consequently, the selector 232a outputs the 16-bit address value {0,ADDR[15:1]}='0 . . . 001'b=1 addr [15:0].

In repose to addr[15:0], the ROM 10 outputs data[15:8] and data[7:0], which together constitute the 16-bit data disposed on the ROM 10 at the location indicated by addr=1 shown in FIG. 9B.

Since the selector 232b is connected to select the input 00, the selector 232b outputs ADDR[0]=1 as byte_select.

Consequently, the selector 232e outputs data_sel[7:0], which is composed of data[15:8] (i.e., flag (=01) and D21), and the selector 232f, which is connected to select the input 00, outputs data_sel[1:0] (=01) to the D flip-flop 234a.

In addition, the selector 232c, which is connected to select the input 00, outputs data_sel[7:2] (D21) to the D flip-flop 234b. The selector 232d is connected to select the input 00 and thus outputs all 0s (a sequence of ten bits all holding 0) to the D flip-flop 234c.

Upon input of a clock pulse to the D flip-flops 234a-234c, the D flip-flop 234a outputs 01 as NDATA_ENABLE [1:0], and the D flip-flop 234b outputs data[7:2] (D21) as DATA [5:0]. In addition, the D flip-flop 234c outputs all 0s (a sequence of 10 bits all holding the value 0) as DATA [15:6].

In this example, at this point in time (i.e., one cycle after the input of address value ADDR from the processor 40), the value of NDATA_ENABLE [1:0] is 01 and thus the decompressor 203 does not decompress DATA yet.

(2) Reading of Second Data

As described above, NDATA_ENABLE [1:0] now holds the value 01. Thus, the selectors 232a and 232b are switched to select the input 01 and the selectors 232c, 232d, and 232f are switched to select the input 00 (=not).

The selector 232a outputs addr[15:0], which is the 16-bit address value {110, ADDR [15:3]}='110 . . . 0'b=$2^{15}+2^{14}$, and thus 16-bit data held at addr=$3 \times M/4$ shown in FIG. 9B partly as data[15:8] and partly as data[7:0] are output from the ROM 10.

The selector 232b outputs ADDR[2]=0 as byte_select. Consequently, the selector 232e outputs data[7:0] (including D22) as data_sel [7:0].

Since NDATA_ENABLE [1:0] holds the value 01, the selector 232f outputs all 0s (=00) to the D flip-flop 234a. In addition, the selector 232c outputs DATA[5:0] (D21) to the D flip-flop 234b. The selector 232d outputs {00, data_sel [7:0]} to the D flip-flop 234c.

Upon input of a next clock pulse to the D flip-flops 234a-234c, the D flip-flop 234a outputs 00 as NDATA_ENABLE[1:0], and the D flip-flop 234b outputs D21 as DATA[5:0]. The D flip-flop 234c outputs DATA[15:6], which carries the bits of the compressed code D20 other than D21.

In this example, at this point in time (i.e., two cycles after the input of address value ADDR from the processor 40), NDATA_ENABLE[1:0] holds the value 00. Therefore, the decompressor 203 acquires DATA (DATA [5:0] and DATA [15:6]) output from the control circuit 210a and decompress the acquired data.

Embodiment 3

The following describes an embodiment in which the first and second arithmetic operations described in Embodiment 1 are modified, with particular emphasis on the difference with Embodiment 1.

<1. Configuration>

Figure 13:
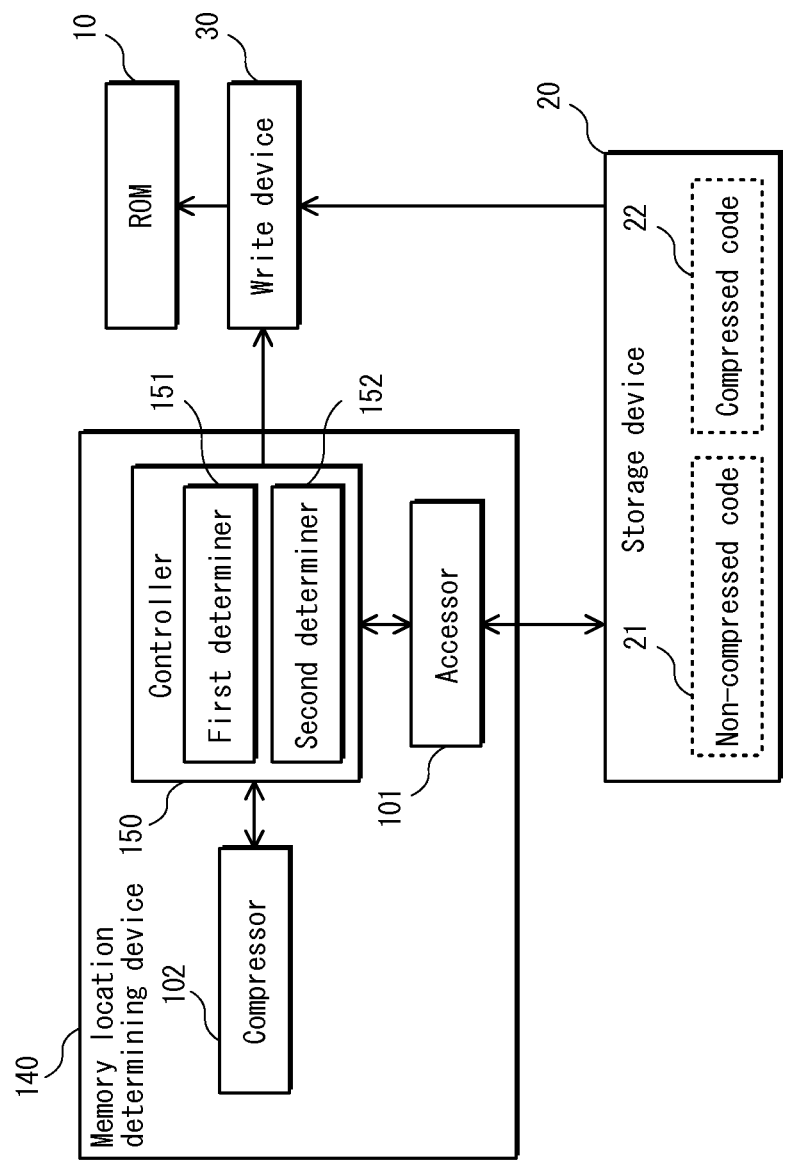
FIG. 13 is a functional block diagram showing important parts of a memory location determining device 140 according to Embodiment 3.
Figure 14:
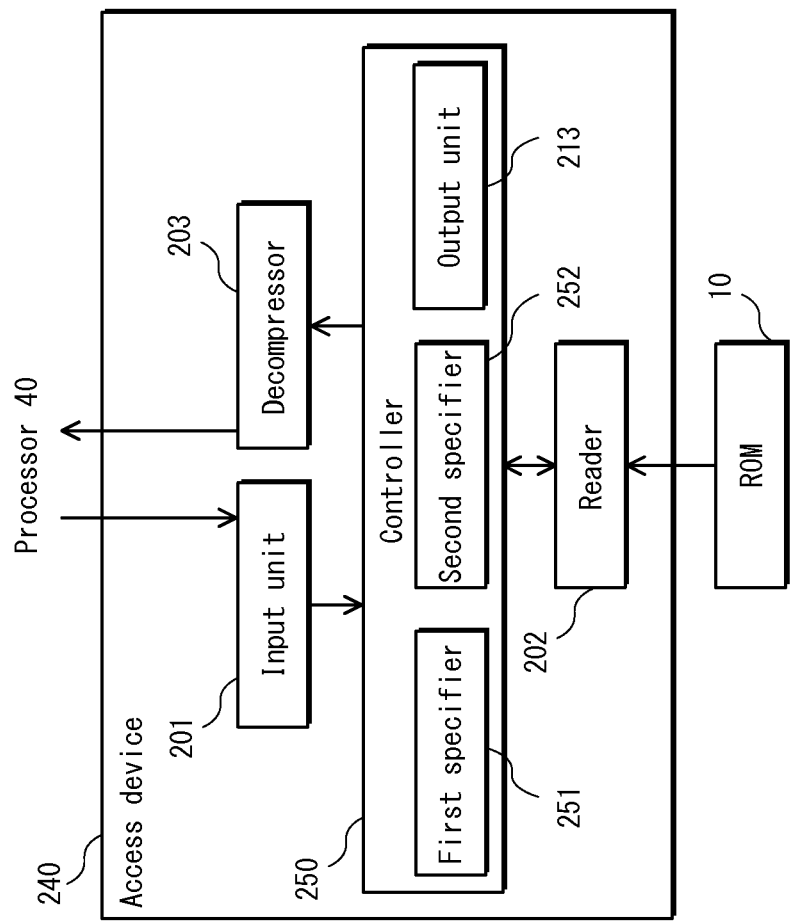
FIG. 14 is a functional block diagram showing important parts of an access device 240 according to Embodiment 3.

FIG. 13 is a functional block diagram showing important parts of a memory location determining device 140 according to Embodiment 3. FIG. 14 is a functional block diagram showing important parts of an access device 240 according to Embodiment 3.

As shown in FIG. 13, the memory location determining device 140 differs from the memory location determining device 100 according to Embodiment 1 in that a controller 150 is included instead of the controller 110. The controller 150 differs from the controller 110 of the memory location determining device 100 according to Embodiment 1 in that a first determiner 151 and a second determiner 152 are included instead of the first determiner 111 and the second determiner 112.

As shown in FIG. 14, the access device 240 differs from the access device 200 according to Embodiment 1 in that a controller 250 is included instead of the controller 210. The controller 250 differs from the controller 210 of the access device 200 according to Embodiment 1 in that a first specifier 251 and a second specifier 252 are included instead of the first specifier 211 and the second specifier 212.

More specifically, the first determiner 151 of the memory location determining device 140 and the first specifier 251 of the access device 240 differ from the first determiner 111 and the first specifier 211, respectively, in that the first arithmetic operation to be performed on the address value ADDR_a and ADDR_b expressed by Equation 5 is selected according to the value of k out of arithmetic operations given as Equation 9 below.

$$k=0: \text{addr}\_a1=\text{addr}\_b1=3\times j$$

$$k=1: \text{addr}\_a1=\text{addr}\_b1=3\times j+\frac{1}{2}$$

$$k=2: \text{addr}\_a1=\text{addr}\_b1=3\times j+2$$

$$k=3: \text{addr}\_a1=\text{addr}\_b1=3\times j+2+\frac{1}{2} \quad \text{[Equation 9]}$$

where j=0, 1, . . . , M/4−1.

In addition, the second determiner 152 of the memory location determining device 140 and the second specifier 252 of the access device 240 are different from the second determiner 112 and the second specifier 212, respectively, in that second arithmetic operation to be performed on the address value ADDR_a and address value ADDR_b expressed by Equation 5 is selected according to the value of k out of arithmetic operations given as Equation 10 below.

$$k=0,1: \text{addr}\_a2=\text{addr}\_b2=3\times j+1$$

$$k=2,3: \text{addr}\_a2=\text{addr}\_b2=3\times j+1+\frac{1}{2} \quad \text{[Equation 10]}$$

where j=0, 1, . . . , M/4−1.

<2. Data>

FIG. 15A shows an example of M N-bit non-compressed codes and M compressed codes resulting from the respective non-compressed codes.

The figure also shows that the non-compressed codes A3-H3 respectively at ADDR 0-7 are compressed into codes A30-H30 and that the length of the compressed codes C30 and E30 exceeds N/2−1 bits.

FIG. 15B shows an example of the locations of the compressed codes (A30-H30) on the ROM 10.

The area AREA20 in the ROM 10 for storing the compressed codes is divided into a first area and a second area for each set of four consecutive address values ADDR sharing the value of j, namely 4×j, 4×j+1, 4×j+2, and 4×j+3, with the value of j common among them (where j=0, 1, . . . , M/4−1).

For example, for a set of four consecutive address values ADDR 0 to 3, the first area is designated AREA21a and the second areas is designated AREA22a. For another set of four consecutive address values ADDR 4 to 7, the first area is designated AREA21b and the second areas is designated AREA22b.

Similarly to the first area AREA1 according to Embodiment 1, each of the first areas AREA21a and AREA21b is for storing the first data of each compressed code in a corresponding set. Also, similarly to the second area AREA2 according to Embodiment 1, each of the second areas AREA22a and AREA22b are for storing the second data of each special compressed code in a corresponding set. Note that a special compressed code refers to a compressed code having a length exceeding Xa bits.

In the example shown in FIG. 15A, the compressed codes C30 and E30 has a length exceeding N/2−1. Consequently, in the example shown in FIG. 15B, the compressed code C30 is stored partly in the first area AREA21a and partly in the second area AREA22a of the ROM 10, whereas the compressed code E30 is stored partly in the first area AREA21b and partly in the second area AREA22b of the ROM 10.

The method for determining the locations of pieces of second data using Equation 9 is described in detail in the sections <3-1. Location Determination Process> and <3-2. Specific Example of Location Determination Process> under the heading of <3. Operation>.

<3. Operation>

The following now describes operation of the memory location determining device 140 and the access device 240.

<3-1. Memory Location Determining Process>

First of all, a description is given of the memory location determining process performed by the memory location determining device 140.

FIG. 16 is a flowchart of the memory location determining process performed by the memory location determining device 140.

As shown in the figure, the memory location determining process performed by the memory location determining device 140 differs from that performed by the memory location determining device 100 according to Embodiment 1 and shown in FIG. 4 in that Steps S51 and S52 are included instead of Steps S5 and S7. Therefore, the following description is given with particular emphasis on Steps S51 and S52.

Upon completion of Steps S1-S4, the first determiner 151 of the controller 150 performs the first arithmetic operation on the address value ADDR_a (Step S51). More specifically, the first determiner 151 performs one of the four arithmetic operations given as Equation 9 that is selected according to the value k, on the address value ADDR_a expressed by Equation 5.

The controller 150 performs Step S6 to make the determination as to the length indicated by the data-length information received from the compressor 102 in Step S4. When the length indicated exceeds Xa bits (Step S6: YES), the second determiner 152 of the controller 150 performs the second arithmetic operation on the address value ADDR_a (Step S52). More specifically, the second determiner 152 performs one of the two arithmetic operations given in Equation 10 selected according to the value k, on the address value ADDR_a expressed by Equation 5.

Upon completion of Step S52, the controller 150 moves onto Step S8.

<3-2. Specific Example of Memory Location Determining Process>

By way of an example shown in FIG. 15, a specific description is given of Steps S51 and S52 of the memory location determining process performed by the memory location determining device 140 described above, with reference to the flowchart shown in FIG. 16.

(1) Processing on Non-Compressed Code A3

In this example, the address value ADDR_a of the non-compressed code A3 is 4×j+0, where j=0. Consequently, the first determiner 151 performs, as the first arithmetic operation, the arithmetic operation corresponding to k=0 out of the four arithmetic operations given as Equation 9 (Step S51). The result value addr_a1 of this first arithmetic operation is 0.

In this example, the data-length information received from the compressor 102 indicates the length of Xa bits or less (Step S6: NO). Consequently, the controller 150 controls the accessor 101 to write the flag (=0) as well as the compressed code (A30) received in Step S4 into the compressed code area 22 of the storage device 20 at the location indicated by the result value addr_a1 (=0) of the first arithmetic operation performed in Step S51 (Step S8).

(2) Processing on Non-Compressed Code B3

The compressed code B30 resulting from the non-compressed code B3 is also processed in a manner similar to the compressed code A30 above. Therefore, the details thereof are omitted. The result value addr_a1 of the first arithmetic operation performed in Step S51 is ½. Consequently, as shown in FIG. 15B, the flag (=0) and the compressed code (B30) that is received in Step S4 are placed in the compressed code area 22 of the storage device 20 at the location indicated by the result value addr_a1 (=½) of the first arithmetic operation.

(3) Processing on Non-Compressed Code C3

In this example, the address value ADDR_a of the non-compressed code C3 is 4×j+2, where j=0. Consequently, the first determiner 151 performs, as the first arithmetic operation, the arithmetic operation corresponding to k=2 out of the four arithmetic operations given as Equation 9 (Step S51). The result value addr_a1 of this first arithmetic operation is 2.

In this example, the data-length information received from the compressor 102 indicates the length exceeding Xa bits (Step S6: YES). Consequently, the first determiner 151 performs, as the second arithmetic operation, the arithmetic operation corresponding to k=2 out of the two arithmetic operations given as Equation 10 (Step S52). The result value addr_a2 of this second arithmetic operation is computed to be 1+½.

Subsequently, the controller 150 controls the accessor 101 to write the flag (=1) as well as the Xa bits (C31) of the compressed code (C30) received in Step S4 into the compressed code area 22 of the storage device 20 at the location indicated by the result value addr_a1 (=2) of the first arithmetic operation performed in Step S51. In addition, as shown in FIG. 15B, the controller 150 writes the bits (C32) of the compressed code (C30) other than the Xa bits (C31) into the compressed code area 22 of the storage device 20 at the location indicated by the result value addr_a2 (=1+½) of the second arithmetic operation performed in Step S52 (Step S8).

(4) Processing on Non-Compressed Code D3

The compressed code D30 resulting from the non-compressed code D3 is also processed in a manner similar to the compressed code A30 above. Therefore, the details thereof are omitted. The result value addr_a1 of the first arithmetic operation performed in Step S51 is 2+½. Consequently, as shown in FIG. 15B, the flag (=0) and the compressed code (D30) that is received in Step S4 are placed in the compressed code area 22 of the storage device 20 at the location indicated by the result value addr_a1 (2+½) of the first arithmetic operation.

<3-3. Access Process>

Next, a description is given of the access process performed by the access device 240.

Figure 17:
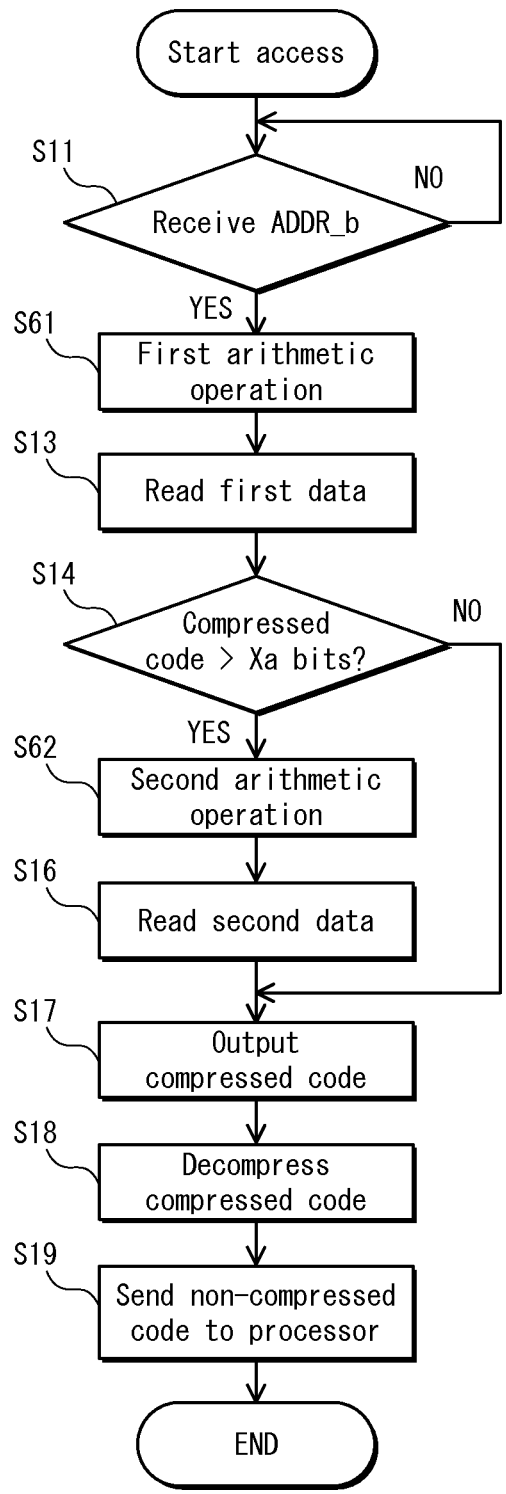
FIG. 17 is a flowchart of an access process performed by the access device 240.

FIG. 17 is a flowchart of the access process performed by the access device 240.

As shown in the figure, the access process performed by the access device 240 differs from that performed by the access device 200 according to Embodiment 1 and shown in FIG. 5 in that Steps S61 and S62 are included instead of Steps S12 and S15. Therefore, the following description is given with particular emphasis on Steps S61 and S62.

Upon receipt of the address value ADDR_b of the desired non-compressed code from the processor 40 via the input unit 201 (Step S11: YES), the first specifier 251 of the controller 250 performs the first arithmetic operation on the address value ADDR_b (Step S61). More specifically, the first determiner 251 performs the arithmetic operation selected according to the value k out of the four arithmetic operations given as Equation 9, on the address value ADDR_a expressed by Equation 5.

The controller 250 performs Step S13 to read the first data and Step S14 to make the determination as to the length of the compressed code. When the length exceeds Xa bits (Step S14: YES), the second determiner 252 of the controller 250 performs the second arithmetic operation on the address value ADDR_b (Step S62). More specifically, the second specifier 252 performs the arithmetic operation selected according to the value k out of the two arithmetic operations given in Equation 10, on the address value ADDR_b expressed by Equation 5.

Upon completion of Step S62, the controller 150 moves onto Step S16.

<3-4. Specific Example of Access Process>

By way of an example shown in FIG. 15, a specific description is given of Steps S61 and S62 of the access process performed by the access device 240 described above, with reference to the flowchart shown in FIG. 17.

In the following description, it is supposed that the access device 240 receives the value 2 as the address value ADDR_b of the non-compressed code C3 from the processor 40.

Upon receipt of the address value ADDR_b (=2) of the desired non-compressed code from the processor 40 via the input unit 201 (Step S11: YES), the first specifier 251 of the controller 250 performs the first arithmetic operation on the address value ADDR_b (Step S61). In this example, the address value ADDR_b of the non-compressed code C2 is $4 \times j+2$, where j=0. The first specifier 251 thus performs, as the first arithmetic operation, the arithmetic operation corresponding to k=2 out of the four arithmetic operations given as Equation 9. The result value addr_b1 of this first arithmetic operation is 2.

The controller 250 controls the reader 202 to access the ROM 10 to read the first data (composed of the flag (=1) and C31) from the location in the first area AREA21a indicated by the result value addr_b1 (=2) of the first arithmetic operation (Step S13).

In this example, the flag included in the first data read in Step S13 is set to 1. The controller 250 thus judges that the length of the compressed code exceeds Xa bits (Step S14: YES).

Consequently, the second specifier 252 of the controller 250 performs the second arithmetic operation on the address value ADDR_b (Step S62). In this example, the second specifier 252 performs, as the second arithmetic operation, the arithmetic operation corresponding to k=2 out of the two arithmetic operations given as Equation 10. The result value addr_b2 of this second arithmetic operation is $1+\frac{1}{2}$.

The controller 250 controls the reader 202 to access the ROM 10 to read the second data (which includes C32) from the location in the second area AREA22a indicated by the result value addr_b2 ($1+\frac{1}{2}$) of the second arithmetic operation (Step S16).

Subsequently, the access device 240 performs Steps S17-S19 in a manner similar to the access device 200 according to Embodiment 1. This completes the access process.

<4. Consideration>

Similarly to the memory location determining device 100 according to Embodiment 1, the memory location determining device 140 according to Embodiment 3 can save the required capacity of the storage area AREA20 on the ROM 10 (see FIG. 15B) under a certain condition. That is, under the condition that at least one of the two compressed codes resulting from the non-compressed codes having the consecutive address values of ADDR_a=$2 \times j$ and $2 \times j+1$ (where j=0, 1, ..., M/2) is not a special compressed code, then the capacity of the storage area AREA20 on the ROM 10 (see FIG. 15B) is calculated to be $3 \times M \times N/4$.

As shown in FIG. 15B, according to Embodiment 3, the first and second areas in any set is contiguous with each other. Therefore, by modifying the access device 240 to be provided with a ROM cache and the controller 250 to read compressed codes from the ROM cache as shown in Modification 3 below, the access device 240 can read the whole special compressed code with one access.

<<Modification 3>>

The following describes a modification of Embodiment 3 to implement the controller 250 of the access device 240 with relatively simple circuitry.

The access device according to Modification 3 includes a control circuit 250a instead of the controller 250 of the access device 240 and additionally includes a ROM cache 11.

The ROM cache 11 stores a copy of at least some of the compressed codes stored on the ROM 10 and outputs data held at the locations indicated by addr+0, addr+1, and addr+2 in response to the address value addr[15:0] forwarded from the control circuit 250a by the reader 202.

In other words, in this example, the control circuit 250a reads the compressed code resulting from the non-compressed code desired by the processor 40 from the ROM cache 11.

For simplicity, the following description is given on precondition that no cache miss occurs.

Figure 18:
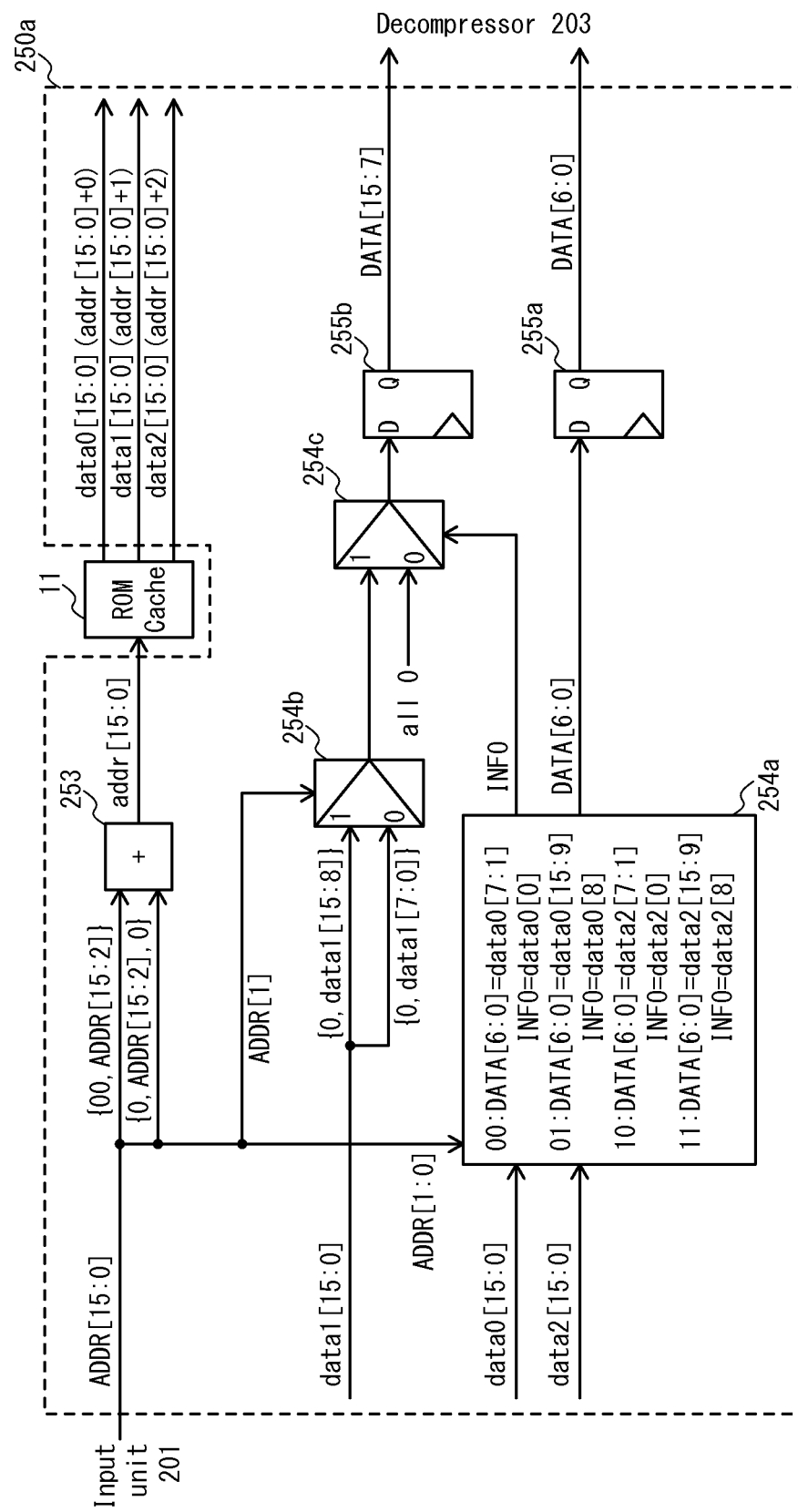
FIG. 18 is a view showing the circuit configuration of a control circuit 250a of an access device according to Modification 3.

FIG. 18 shows the circuit configuration of a control circuit 250a of an access device according to Modification 3.

In the figure, the address value received from the processor 40 via the input unit 201 is designated "ADDR", and the address value forwarded to the ROM cache 11 by the reader 202 is designated "addr". Each of the address values ADDR and addr is a 16-bit value. In the example shown in the figure, in addition, N is 16, and the ROM cache 11 outputs data0, data1, and data2 each of which is 16-bit data, in response to the 16-bit address value addr.

As shown in the figure, the control circuit 250a of the access device according to Modification 3 includes an adder 253, selectors 254a-254c, and D flip-flops 255a and 255b.

The control circuit 250a outputs DATA one cycle after the input of the address value ADDR from the processor 40, and the decompressor 203 acquires the DATA as an effective compressed code and decompresses it.

The following is a specific example of the operation of the control circuit 250a performed in response to the input of the address value (=2) of the non-compressed code C3 shown in FIG. 15A, from the processor 40.

When the address value ADDR [15:0]='0 ... 010'b=2 is input from the processor 40 via the input unit 201, the adder 253 receives two inputs, which are {00,ADDR [15:2]}='0 ... 0'b=0 and {0,ADDR[15:2],0}='0 ... 0'b=0. The adder 253 then outputs '0 ... 0'b as addr[15:0].

In response to this addr[15:0], the ROM cache 11 outputs the pieces of 16-bit data held at addr 0, 1, and 2 shown in FIG. 15B, as data0[15:0], data1[15:0], and data2[15:0], respectively.

Since the value of ADDR[1:0] is 10, the selector 254a is connected to select the input 10 and thus outputs data2 [0]=1 as INFO. As the other input DATA [6:0], the selector 254a outputs data2[7:1] (C31) to the D flip-flop 255a.

Since the value of ADDR[1] is 1, the selector 254b is connected to select the input 1. In addition, since the value of 254c is 1, the selector 254c is connected to select input 1. Consequently, the selector 254c outputs {0, data1[15:8]} that includes the data C32 to the D flip-flop 255b.

Upon input of the next clock pulse to the D flip-flops 255a and 255b, the D flip-flop 255a outputs DATA[6:0] (C31), and the D flip-flop 255b outputs DATA[15:7] (which includes C32).

Therefore, the decompressor 203 acquires DATA (DATA [6:0] and DATA[15:7]) output from the control circuit 250a and decompress it.

As has been described above, the first and second areas in each set are contiguous as shown in FIG. 15B. This arrangement enables the control circuit 250a according to Modification 3 to read one special compressed code in one cycle despite that the special compressed code is separated in the first and second areas.

<Supplementary Note>

Up to this point, the memory location determining device, memory location determining method, data structure, memory, access device, and memory access method according to the present invention have been described by way of the Embodiments and Modifications (each of which hereinafter may be simply referred to as an embodiment). Various other modifications including the following can be made to the present invention. It should be naturally appreciated that the present invention is not limited to the memory location determining device, memory location determining method, data structure, memory, access device, and memory access method specifically as described above.

(1) The above embodiments are described using examples in which the M pieces of N-bit data according to the present invention are the M N-bit non-compressed codes shown in FIG. 3A, 9A, or 15A. Similarly, the M pieces of compressed data each having a length of N bits or less according to the present invention are the compressed codes having a length of N bits or less shown in FIG. 3A, 9A, or 15A. However, other data may be used as the M pieces of N-bit data and the M pieces of compressed data having a length less than N bits according to the present invention.

In the embodiments described above, the value of N is 16. However, this is merely a non-limiting example and N may be larger or smaller than 16.

The flag used in Embodiments 1 and 3 is a one-bit flag and is a two-bit flag in Embodiment 2. However, these are merely non-limiting examples and the flag may be composed of more than two bits.

(2) The memory location determining device according to each embodiment determines the memory locations for storing compressed codes in the ROM 10, and the access device according to each embodiment access the ROM 10. However, instead of the ROM, the memory location determining device according to the present invention may determined memory locations for storing compressed codes on a memory other than a ROM. The access device according to the present invention may access such a memory other than the ROM.

(3) The maximum length of first data is N/2−1 according to Embodiments 1 and 3, and N/2−2 according to Embodiment 2. However, these maximum lengths of first data described in the embodiments are merely non-limiting examples and a different maximum length may be applicable.

In other words, the maximum length of first data is determined in accordance with the number of compressed codes sharing one sub-area (of N bits in the embodiments) corresponding to one address value addr in the memory area of the ROM 10.

Suppose, for example, that one sub-area corresponding to one address value is shared by i compressed codes. In this case, the maximum length of first data is determined as N/i−1 in Embodiments 1 and 3 and as N/i−2 in Embodiment 2.

In the embodiments described above, in a memory area of the ROM 10, one sub-area corresponding to one address value addr can be used to store two pieces of special compressed data. Therefore, the maximum length of second data according to the embodiments is N/2.

However, these maximum lengths of the second data described in the embodiments are merely non-limiting examples and a different maximum length may be applicable. For example, one sub-area can be used to store four pieces of special compressed data. In this case, the maximum length of second data is N/4. In another example, one sub-area can be used to store one piece of special compressed data. In this case the maximum length of second data is N. In other words, the number of pieces of first data that can be stored in one sub-area of the first area is not necessarily equal to the number of pieces of second data that can be stored in one sub-area of the second area.

The start address of second data is at M/2 (see Equations 2 and 4) in Embodiment 1 and at M/2 or 3×M/4 (see Equations 6-8) in Embodiment 2. However, these are merely non-limiting examples and the start address may be appropriately modified.

In Embodiment 3, for each set of four compressed codes corresponding to four consecutive address values, the area for storing second data (AREA22a shown in FIG. 15B, for example) is located enclosed with an area for storing first data (AREA21a shown in FIG. 15B, for example). However, this arrangement of memory areas is merely one non-limiting example. Any other arrangement is applicable as long as an area for storing second data is adjacent directly or non-directly to an area for storing first data for each set.

For example, one contiguous memory area is reserved for storing first data and a memory area immediately subsequent to that area is reserved for storing second data or vice versa.

In Embodiment 3, one set is composed of four consecutive address values. However, this is merely one non-limiting example. The number of address values included in one set is not limited to four. In addition, the address values included in one set is not necessarily consecutive.

(4) The memory location determining device of each embodiment includes the compressor 102, and the access device of each embodiment includes the decompressor 203.

However, the compressor 102 is not an essential component of the memory location determining device. The functionality thereof may be implemented by a separate device. In such a case, a modification is necessary to ensure that the compressed codes generated by the separate device are stored in the storage device 20 each in association with data-length information indicating the length of the corresponding compressed code. The memory location determining device as modified in this way reads compressed codes from the storage device 20 and stores them into the compressed code area 22 at the determined locations.

The decompressor 203 is not an essential component to the access device and the functionality thereof may be implemented by a separate device.

(5) The ROM cache 11 in Modification 3 stores a copy of at least some of the compressed codes stored on the ROM 10 and outputs data held at the locations indicated by addr+0, addr+1, and addr+2 in response to the address value addr forwarded from the control circuit 250a by the reader 202.

However, the modification may be without the ROM cache 11. That is, the compressed codes may be read directly from the ROM 10 as in Modifications 1 and 2. In this case, however, it takes two cycles to read the entire special compressed code from the input of address value ADDR from the processor 40.

For simplicity, Modifications are described without mentioning the detailed input and output specifications. Naturally, it is applicable to add an arrangement to adjust the timing for reading and writing a compressed code or to employ a request signal and a response signal, for example.

(6) In the embodiments described above, each piece of special compressed data is divided into two portions, such that X bits (Xa bits in Embodiments 1 and 3, and Xb in Embodiment 2) thereof are included in first data and the other bits are included in second data.

However, the number of portions into which each piece of special compressed data is divided is not limited to two. A piece of special compressed data may be divided into three or more portions.

In one example of dividing a piece of special compressed data into three portions, the first data includes Xc bits (Xc<N), the second data includes Y bits (Y<N), and the third data includes all bits other than the Xc and Y bits. The third data is stored at the memory location indicated by the result value of a third arithmetic operation performed on the address value ADDR_a that specifies the location in the non-compressed block of the non-compressed code corresponding to the special compressed data.

Note that the third arithmetic operation differs from both the first and second arithmetic operations. No third data is obtained depending on the length of special compressed data. To indicate whether or not the third data is present, the second data needs to include a flag (one-bit flag, for example) indicating that the special compressed data has a length exceeding Xc+Y bits.

(7) Part or all of the components described in the embodiments above may be embodied in the form of an integrated circuit composed of a single chip or a plurality of chips, a computer program, or any other forms.

The components described in Embodiments 1-3 implement their functionalities by cooperating with a processor included in a corresponding memory location determining device or access device.

(8) A program for causing a processor to perform any of the memory location determining processes described in relation to the memory location determining devices described in Embodiments 1-3 (see FIGS. 4, 10, and 16) may be distributed in the form a recording medium or via various communication channels. Similarly, program for causing a processor to perform any of the access processes described in relation to the access devices described in Embodiments 1-3 (see FIGS. 5, 11, and 17) may be distributed in the form a recording medium or via various communication channels. Examples of such a recording medium include IC card, hard disk, optical disc, flexible disk, ROM, and flash memory. The program distributed is stored in memory that is readable by a processor included in a device to be available for use. Then, the functionality of the memory location determining device or access device according to Embodiment 1-3 is implemented through the execution of the processor by the processor.

(9) The memory location determining and device access device according to each embodiment may be combined with one or more or all of the modifications (1) through (8) described above.

(10) The following is the description of the embodiments and modifications of the present invention, along with their respective advantageous effects.

(a) A memory location determining device according to one aspect of the present invention is for determining locations in a memory. The locations are for storing M pieces of compressed data each of which is compressed from a corresponding one of M pieces of N-bit data to be less than N bits. The M pieces of N-bit data constitutes a data block. The memory location determining device includes a first determiner and a second determiner. For each of the M pieces of compressed data, the first determiner performs a first arithmetic operation on an address value of a corresponding piece of N-bit data in the data block, and determines a location indicated by a result value of the first arithmetic operation as a location for storing first data of the piece of compressed data. The first data has a length of L bits or less, where L<N. When the piece of compressed data is ordinary compressed data having a length of X bits or less, where X<L<N, the first data includes all bits of the piece of ordinary compressed data and a flag indicates that the length is X bits or less. When the piece of compressed data is special compressed data having a length exceeding X bits, the first data includes X bits of the piece of special compressed data and a flag indicating that the length exceeds X bits. For each piece of special compressed data, the second determiner performs a second arithmetic operation on the address value of the corresponding piece of N-bit data in the data block, and determines a location indicated by a result value of the second arithmetic operation as a location for storing second data of the piece of special compressed data. The second data includes at least one or more bits of the piece of special compressed data other than the X bits. The second arithmetic operation yields a common result value when performed on any address value in a set composed of K address values out of the respective address values of the M pieces of N-bit data and yields a different result value when performed on any address value in a different set, where K≤M.

Optionally, each result value of the first arithmetic operation may indicate a different location in a first area of the memory, and each result value of the second arithmetic operation may indicate a location in a second area of the memory, the second area being contiguous with the first area.

A memory location determining method according to one aspect of the present invention is for determining locations in a memory. The locations are for storing M pieces of compressed data each of which is compressed from a corresponding one of M pieces of N-bit data to be less than N bits. The M pieces of N-bit data constitutes a data block. The method includes a first determining step and a second first determining step. The first determining step involves: performing, for each of the M pieces of compressed data, a first arithmetic operation on an address value of a corresponding piece of N-bit data in the data block; and determining a location indicated by a result value of the first arithmetic operation as a location for storing first data of the piece of compressed data, the first data having a length of L bits or less, where L<N. When the piece of compressed data is ordinary compressed data having a length of X bits or less, where X<L<N, the first data includes all bits of the piece of ordinary compressed data and a flag indicates that the length is X bits or less. When the piece of compressed data is special compressed data having a length exceeding X bits, the first data includes X bits of the piece of special compressed data and a flag indicating that the length exceeds X bits. The second determining step involves: performing, for each piece of special compressed data, a second arithmetic operation on the address value of the corresponding piece of N-bit data in the data block; and determining a location indicated by a result value of the second arithmetic operation as a location for storing second data of the piece of special compressed data, the second data including at least one or more bits of the piece of special compressed data other than the X bits. The second arithmetic operation yields a common result value when performed on any address value in a set composed of K address values out of the address values of the M pieces of N-bit data and yields a different result value when performed on any address value in a different set, where K≤M.

With this memory location determining device and memory location determining method, the memory locations for storing the respective pieces of compressed data are determined as indicated by the result values of the predetermined arithmetic operation(s) (the first arithmetic operation or the first and second arithmetic operations) performed on the address value of a corresponding compressed data in the N-bit data block, provided that the second data is all bits of the first data other than the X bits.

Consequently, a specific piece of compressed data corresponding to N-bit data desired by the processor can be read from the memory storing the respective pieces of compressed data at the locations determined by the memory location determining device and the memory location determining method. In particular, the specific piece of compressed data is read from the memory location(s) indicated by a result value of the predetermined arithmetic operation(s) performed on the address value of the n-bit data. That is, the piece of compressed data corresponding to N-bit data desired by the processor can be duly read without using an address translation table.

The second data may include only a portion of the bits of the first data other than the X bits. In that case, the memory location is also determined for the third data including all bits of the special compressed data other than the first and second data. The memory location for the third data is indicated by a result value of a third arithmetic operation performed on the address value of the corresponding N-bit data in the data block. Note that the third arythmetic operation differs from both the first and second arithmetic operations.

In other words, when the second data includes some bits rather than all bits of the first data other than the X bits, the desired piece compressed data can be duly read without having to use an address translation table. This is achieved by placing the first, second, and third data of the piece compressed data at memory locations specified by performing the predetermined arithmetic operations (the first, second, and third arithmetic operations, in this case) on the address value of the corresponding N-bit data in the data block.

(b) Optionally, the first area may be a (N×M/2)-bit area, each flag may be an F-bit flag, and each piece of special compressed data may have a length exceeding N/2–F bits. For each of the M pieces of compressed data, the first determiner may perform a division by 2 of the address value of the corresponding piece of N-bit data in the data block and determine a location indicated by a result value of the division as the location for storing the first data of the piece of the compressed data.

This memory location determining device determines the memory location for the first data of each piece of compressed data by a relatively simple arithmetic operation, which is a division by 2 of the address value indicating the location of corresponding N-bit data in the data block.

Consequently, the first data of a specific piece of compressed data corresponding to the N-bit data desired by the processor can be read from the memory location indicated by the result value of the simple arithmetic operation performed on the address value of the N-bit data.

(c) Optionally, the second area may be a (N×M/4)-bit area. Out of the respective address values of the M pieces of N-bit data in the data block, each two address values may be taken as a set. For each set of two address values, the second arithmetic operation may yield two result values each indicating a location starting N/2 bits apart from a location indicated by the other result value.

With this configuration, the second area is divided into N/2-bit sub-areas, and each sub-areas is used to store the second data of two pieces of compressed data corresponding to two pieces of N-bit data in the same set. The two pieces of N-bit data in the N-bit data block have different address values.

That is, this memory location determining device can save the memory capacity used to store M pieces of compressed data in a manner that a specific piece of compressed data corresponding to N-bit data desired by a processor can be read without having to use an address translation table. This memory capacity saving is achieved on condition that at least one of the two pieces of compressed data corresponding to the pieces of N-bit data having the address values included in the same set is not a special compressed data.

(d) Optionally, the second area may be a (N×M×3/8)-bit area. Out of the respective address values of the M pieces of N-bit data in the data block, each four address values may be taken as a set. For each set of four address values, the second arithmetic operation may yield three result values. As the location for storing the second data of a piece of special compressed data in a set, the second determiner may determine one out of the three locations indicated by the three result values yielded for the set, the one location not for storing the second data of any other piece of special compressed data in the set. The flag included in the first data of the piece of special compressed data may be a two-bit flag indicating the one location determined for storing the second data out of the three locations.

With this configuration, the three sub-areas are used to store the second data of the four pieces of compressed data corresponding to the four address values included in the same set.

That is, this memory location determining device can save the memory capacity used to store M pieces of compressed data in a manner that a specific piece of compressed data corresponding to N-bit data desired by a processor can be read without having to use an address translation table. This memory capacity saving is achieved on condition that at least one of the four pieces of compressed data corresponding to the pieces of N-bit data having the address values included in the same set is not a special compressed data.

In addition, when the piece of compressed data corresponding to the N-bit data desired by the processor is special compressed data, once the first data of the special compressed data is read, the flag included in the first data allows an easy determination of one of the three regions in which the second data of the special compressed data is stored.

(e) Optionally, out of the respective address values of the M pieces of N-bit data in the data block, each J address values may be taken as a set, where K≤J≤M. When performed on any address value in one set, the first arithmetic operation as well as the second arithmetic operation may yield a result value indicating a location in a first area of the memory. When performed on any address value in another set, the first arithmetic operation as well as the second arithmetic operation may yield a result value indicating a location in a second area of the memory, the second area differing from the first area.

This memory location determining device can place the first and second data constituting a piece of special compressed data at the memory locations close to each other.

Suppose that the memory stores the pieces of compressed data at the memory locations determined by the memory location determining device and is provided with a burst transfer function. The burst transfer function allows the memory to output data stored at a plurality of addresses in response to one address value indicating one memory location. In this case, the possibility is increased that the entire special compressed data can be read by one access.

(f) Optionally, the J address values in each set may be four consecutive address values out of the respective address values of the M pieces of N-bit data in the data block. When performed on each of a first address value and a second address value both included in the one set, the second arithmetic operation may yield a common result value indicating a common location that is one sub-area of the first area. When performed on each of a third address value and a fourth address value both included in the one set, the second arithmetic operation may yield a common result value indicating a common location that is N/2 bits apart from the location indicated by the result value yielded by the second arithmetic operation performed on the first and second address values. When performed on any address value in the one set, the first arithmetic operation may yield a result value indicating a location different within the first area from any of the locations indicated by the result values yielded by the second arithmetic operation performed on the first, second, third, and fourth address values.

This memory location determining device determines the memory locations for storing the respective pieces of compressed data corresponding to four consecutive address values within the same area of the memory area.

Suppose that the memory stores the pieces of compressed data at the memory locations determined by the memory location determining device and is provided with the burst transfer function. In this case, the possibility is increased that the four pieces of compressed data corresponding to N-bit data having four consecutive address values can be read by one access.

The memory locations of the respective pieces of compressed data determined by the memory location determining device are particularly effective in the case where pieces of compressed data are read from the close memory locations. For example, the memory locations determined by the memory location determining device are effective when the pieces of compressed data are program codes. It is because execution of the program codes exhibits spatial locality.

(g) A data structure according to one aspect of the present invention is used for placing M pieces of compressed data each compressed from a corresponding one of M pieces of N-bit data to be less than N bits. The M pieces of N-bit data are elements of a program code block placed in a contiguous memory area to operate. The data structure has a first area and a second area. The first area is for placing first data of each of the M pieces of compressed data at a location indicated by a result value of a first arithmetic operation performed on an address value indicating a location of a corresponding piece of N-bit data in the contiguous memory area. The first data has a length of L bits or less, where L<N. When the piece of compressed data is ordinary compressed data having a length of X bits or less, where X<L<N, the first data including all bits of the piece of ordinary compressed data and a flag indicating that the length is X bits or less. When the piece of compressed data is special compressed data having a length exceeding X bits, the first data including X bits of the piece of special compressed data and a flag indicating that the length exceeds X bits. The second area is for placing second data of each piece of special compressed data at a location indicated by a result value of a second arithmetic operation performed on the address value indicating the location of the corresponding piece of N-bit data in the contiguous memory area. The second data includes at least one or more bits of the piece of special compressed data other than the X bits. The second arithmetic operation yields a common result value when performed on any address value in a set composed of K address values out of the respective address values of the M pieces of N-bit data and yields a different result value when performed on any address value in a different set, where K≤M.

This data structure eliminates the need to use an address translation table to read a specific piece of compressed data corresponding to N-bit data desired by a processor from a memory storing the pieces of compressed data as defined by the data structure, provided that the second data is all bits of the first data other than the X bits.

(h) A memory according to one aspect of the present invention stores M pieces of compressed data each compressed from a corresponding one of M pieces of N-bit data to be less than N bits. The M pieces of N-bit data constitute a data block. The memory has a first memory area and a second memory area. The first memory area stores first data of each of the M pieces of compressed data at a location indicated by a result value of a first arithmetic operation performed on an address value of a corresponding piece of N-bit data in the data block. The first data has a length of L bits or less, where L<N. When the piece of compressed data is ordinary compressed data having a length of X bits or less, where X<L<N, the first data includes all bits of the piece of ordinary compressed data and a flag indicating that the length is X bits or less. When the piece of compressed data is special compressed data having a length exceeding X bits, the first data includes X bits of the piece of special compressed data and a flag indicating that the length exceeds X bits. The second memory area stores second data of each piece of special compressed data at a location indicated by a result value of a second arithmetic operation performed on the address value of the corresponding piece of N-bit data in the data block. The second data includes at least one or more bits of the piece of special compressed data other than the X bits. The second arithmetic operation yields a common result value when performed on any address value in a set composed of K address values out of the respective address values of the M pieces of N-bit data and yields a different result value when performed on any address value in a different set, where K≤M.

Optionally, the memory may be a read only memory.

This memory eliminates the need to use an address translation table to read a specific piece of compressed data corresponding to N-bit data desired by a processor, provided that the second data is all bits of the first data other than the X bits.

(i) An access device according to one aspect of the present invention is for accessing the memory as defined in (h) above. The access device includes: an input unit that receives an address value used by a processor to access a piece of N-bit data; a first that specifier performs a first arithmetic operation on the received address, and specifies a location on the memory indicated by a result value of the first arithmetic operation as a location storing first data of a piece of compressed data corresponding to the piece of N-bit data, the first data having a length of L bits or less, and including all or X bits of the piece of compressed data and a flag indicating whether a length of the piece of compressed data exceeds X bits or not; a second specifier that performs a second arithmetic operation on the received address value when the flag included in the first data indicates that the piece of compressed data exceeds X bits, and specifies a location on the memory indicated by a result value of the second arithmetic operation as a location storing second data of the piece of compressed data, the second data including at least one or more bits of the piece of compressed data other than the X bits; and an output unit that outputs the bits of the piece of compressed data included in the first data and also output the second data when the second specifier specifies the location storing the second data. The second arithmetic operation yields a common result value when performed on any address value in a set composed of K address values out of the respective address values of the M pieces of N-bit data and yields a different result value when performed on any address value in a different set, where K≤M.

A memory access method according to one aspect of the present invention is for accessing the memory as defined (h) above. The method includes: an input step of receiving an address value used by a processor to access a piece of N-bit data; a first specifying step of performing a first arithmetic operation on the received address, and of specifying a location on the memory indicated by a result value of the first arithmetic operation as a location storing first data of a piece of compressed data corresponding to the piece of N-bit data, the first data having a length of L bits or less, and including all or X bits of the piece of compressed data and a flag indicating whether a length of the piece of compressed data exceeds X bits or not; and a second specifying step of performing a second arithmetic operation on the received address value when the flag included in the first data indicates that the piece of compressed data exceeds X bits, and of specifying a location on the memory indicated by a result value of the second arithmetic operation as a location storing second data of the piece of compressed data, the second data including at least one or more bits of the piece of compressed data other than the X bits; and an output step of outputting the bits of the piece of compressed data included in the first data and also output the second data when the second specifier specifies the location storing the second data. The second arithmetic operation yields a common result value when performed on any address value in a set composed of K address values out of the respective address values of the M pieces of N-bit data and yields a different result value when performed on any address value in a different set, where K≤M.

This access device and memory access method eliminates the need to use an address translation table to read a specific piece of compressed data corresponding to N-bit data desired by a processor, provided that the second data is all bits of the first data other than the X bits.

(j) Optionally, the access device may further include a decompressor that decompresses the compressed data into N-bit data and sends the N-bit data to the processor.

With this access device, the processor is allowed to acquire the desired piece of N-bit data that is decompressed from the compressed data.

INDUSTRIAL APPLICABILITY

The memory location determining device according to the present invention is usable to determine the memory locations for pieces of compressed data.

REFERENCE SIGNS LIST

10 ROM
20 storage device
30 write device
100, 120, 140 memory location determining device
101 accessor
102 compressor
110, 130, 150, 210, 230, 250 controller
111, 151 first determiner
112, 131, 152 second determiner
200, 220, 240 access device
201 input unit
202 reader
203 decompressor
211, 251 first specifier
212, 231, 252 second specifier
213 output unit

The invention claimed is:

1. A memory location determining device for determining locations in a memory, the locations for storing M pieces of compressed data each compressed from a corresponding one of M pieces of N-bit data to be less than N bits, the M pieces of N-bit data constituting a data block, the memory location determining device comprising:

a judgment unit configured to judge, for each of the M pieces of compressed data, whether a piece of compressed data is ordinary compressed data or special compressed data, the ordinary compressed data having a length of X bits or less, where X<N, the special compressed data having a length of Y bits, where Y>X;

a division unit configured to, with respect to each of the M pieces of compressed data, when the judgment unit judges that the piece of compressed data is special compressed data, divide the piece of compressed data being the special compressed data into first compressed data having a length of X bits and second compressed data having a length of Y−X bits;

a first determiner configured to
  perform, for each of the M pieces of compressed data, a first arithmetic operation on an address value of a corresponding piece of N-bit data in the data block, and
  determine a location indicated by a result value of the first arithmetic operation as a location for storing first data of the piece of compressed data, the first data having a length of L bits or less, where L<N,
  wherein when the piece of compressed data is ordinary compressed, where X<L<N, the first data includes all bits of the piece of ordinary compressed data and a flag indicates that the length is X bits or less, and
  wherein when the piece of compressed data is special compressed data, the first data includes the first compressed data and a flag indicating that the length exceeds X bits; and a second determiner configured to
  perform, for each piece of special compressed data, a second arithmetic operation on the address value of the corresponding piece of N-bit data in the data block, and
  determine a location indicated by a result value of the second arithmetic operation as a location for storing second data of the piece of special compressed data, the second data including the second compressed data,
  wherein the second arithmetic operation is selected from a plurality of second arithmetic operations based on a status of one or more pieces of special compressed data among the M pieces of compressed data.

2. The memory location determining device according to claim 1, wherein:
  each result value of the first arithmetic operation indicates a different location in a first area of the memory, and
  each result value of the second arithmetic operation indicates a location in a second area of the memory, the second area being contiguous with the first area.

3. The memory location determining device according to claim 2, wherein:
  the first area is a (N×M/2)-bit area,
  each flag is an F-bit flag, each piece of special compressed data has a length exceeding N/2−F bits, and the first determiner performs, for each of the M pieces of compressed data, a division by 2 of the address value of the corresponding piece of N-bit data in the data block and determines a location indicated by a result value of the division as the location for storing the first data of the piece of the compressed data.

4. The memory location determining device according to claim 3, wherein:

when the second area is a (N×M/4)-bit area, and out of the respective address values of the M pieces of N-bit data in the data block, each two address values are taken as a set, one second arithmetic operation is selected among the plurality of second arithmetic operations, and for each set of two address values, the one second arithmetic operation yields two result values each indicating a location starting N/2 bits apart from a location indicated by the other result value.

5. The memory location determining device according to claim 3, wherein:

when the second area is a (N×⅜)-bit area, and out of the respective address values of the M pieces of N-bit data in the data block, each four address values are taken as a set, a group of three second arithmetic operations is selected among the plurality of second arithmetic operations, and for each set of four address values, the group of three second arithmetic operations yields three result values, as the location for storing the second data of a piece of special compressed data in the set, the second determiner determines one out of the three locations indicated by the three result values yielded for the set, the one location not for storing the second data of any other piece of special compressed data in the set, and the flag included in the first data of the piece of special compressed data is a two-bit flag indicating the one location determined for storing the second data out of the three locations.

6. The memory location determining device according to claim 1, wherein:

when out of the respective address values of the M pieces of N-bit data in the data block, each J address values are taken as a set, where K≤J≤M, one or more second arithmetic operations are selected, when performed on any address value in one set, the first arithmetic operation as well as the one or more second arithmetic operations yields a result value indicating a location in a first area of the memory, and when performed on any address value in another set, the first arithmetic operation as well as the one or more second arithmetic operations yields a result value indicating a location in a second area of the memory, the second area differing from the first area.

7. The memory location determining device according to claim 6, wherein:

the J address values in each set are four consecutive address values out of the respective address values of the M pieces of N-bit data in the data block, when performed on each of a first address value and a second address value both included in the one set, the one or more second arithmetic operations yields a common result value indicating a common location that is one sub-area of the first area, when performed on each of a third address value and a fourth address value both included in the one set, the one or more second arithmetic operations yields a common result value indicating a common location that is N/2 bits apart from the location indicated by the result value yielded by the one or more second arithmetic operations performed on the first and second address values, and when performed on any address value in the one set, the first arithmetic operation yields a result value indicating a location different within the first area from any of the locations indicated by the result values yielded by the one or more second arithmetic operations performed on the first, second, third, and fourth address values.

8. A method for determining locations in a memory, the locations for storing M pieces of compressed data each compressed from a corresponding one of M pieces of N-bit data to be less than N bits, the M pieces of N-bit data constituting a data block, the method comprising:

a judging step of, for each of the M pieces of compressed data, judging whether a piece of compressed data is ordinary compressed data or special compressed data, the ordinary compressed data having a length of X bits or less, where X<N, the special compressed data having a length of Y bits, where Y>X;

a dividing step of, with respect to each of the M pieces of compressed data, when it is judged that the piece of compressed data is special compressed data, dividing the piece of compressed data being the special compressed data into first compressed data having a length of X bits and second compressed data having a length of Y−X bits;

a first determining step of performing, for each of the M pieces of compressed data, a first arithmetic operation on an address value of a corresponding piece of N-bit data in the data block, and determining a location indicated by a result value of the first arithmetic operation as a location for storing first data of the piece of compressed data, the first data having a length of L bits or less, where L<N, wherein when the piece of compressed data is ordinary compressed data, where X<L<N, the first data includes all bits of the piece of ordinary compressed data and a flag indicates that the length is X bits or less, and wherein when the piece of compressed data is special compressed data, the first data includes the first compressed data and a flag indicating that the length exceeds X bits; and a second determining step of performing, for each piece of special compressed data, a second arithmetic operation on the address value of the corresponding piece of N-bit data in the data block, and determining a location indicated by a result value of the second arithmetic operation as a location for storing second data of the piece of special compressed data, the second data including the second compressed data, wherein the second arithmetic operation is selected from a plurality of second arithmetic operations based on a status of one or more pieces of special compressed data among the M pieces of compressed data.

9. A non-transitory memory storing M pieces of compressed data each compressed from a corresponding one of M pieces of N-bit data to be less than N bits, the M pieces of N-bit data constituting a data block, the memory comprising:

a first memory area and a second memory area, wherein:

with respect to each of the M pieces of compressed data, when a length of a piece of compressed data having a length of Y bits exceeds X bits, the piece of compressed data is divided into first compressed data having a length of X bits and second compressed data having a length of Y–X bits, the first memory area stores first data of each of the M pieces of compressed data at a location indicated by a result value of a first arithmetic operation performed on an address value of a corresponding piece of N-bit data in the data block, the first data having a length of L bits or less, where L<N, when the piece of compressed data is ordinary compressed data having a length of X bits or less, where X<L<N, the first data includes all bits of the piece of ordinary compressed data and a flag indicating that the length is X bits or less, when the piece of compressed data is special compressed data having a length of Y bits, where Y>X, the first data includes the first compressed data and a flag indicating that the length exceeds X bits, the second memory area stores second data of each piece of special compressed data at a location indicated by a result value of a second arithmetic operation performed on the address value of the corresponding piece of N-bit data in the data block, the second data including the second compressed data Y, and the second arithmetic operation is selected from a plurality of second arithmetic operations based on a status of one or more pieces of special compressed data among the M pieces of compressed data.

10. The non-transitory memory according to claim 9, wherein the non-transitory memory is a read only memory.

11. An access device for accessing the memory as defined in claim 9, the access device comprising:

an input unit configured to receive an address value used by a processor to access a piece of N-bit data;

a first specifier configured to
perform the first arithmetic operation on the received address, and
specify a location on the memory indicated by a result value of the first arithmetic operation as a location storing first data of a piece of compressed data corresponding to the piece of N-bit data, the first data having a length of L bits or less, and including all or X bits of the piece of compressed data and a flag indicating whether a length of the piece of compressed data exceeds X bits or not;

a second specifier configured to
perform the second arithmetic operation on the received address value when the flag included in the first data indicates that the piece of compressed data exceeds X bits, and
specify a location on the memory indicated by a result value of the second arithmetic operation as a location storing second data of the piece of compressed data, the second data including the Y–X bits of the piece of compressed data other than the X bits; and an output unit configured to:
when the flag indicates that the length of the piece of compressed data does not exceed X bits, output, as a compressed code, the piece of compressed data included in the first data, and
when the flag indicates that the length of the piece of compressed data exceeds X bits, output a compressed code that is composed of the piece of compressed data included in the first data and,
wherein the second arithmetic operation is selected from a plurality of second arithmetic operations based on a status of one or more pieces of special compressed data among the M pieces of compressed data.

12. The access device according to claim 11, further comprising:

a decompressor configured to decompress the compressed data into N-bit data and sends the N-bit data to the processor.

13. A method for accessing the memory as defined in claim 10, the method comprising:

an input step of receiving an address value used by a processor to access a piece of N-bit data;

a first specifying step of
performing the first arithmetic operation on the received address, and
specifying a location on the memory indicated by a result value of the first arithmetic operation as a location storing first data of a piece of compressed data corresponding to the piece of N-bit data, the first data having a length of L bits or less, and including all or X bits of the piece of compressed data and a flag indicating whether a length of the piece of compressed data exceeds X bits or not; and a second specifying step of
performing the second arithmetic operation on the received address value when the flag included in the first data indicates that the piece of compressed data exceeds X bits, and
specifying a location on the memory indicated by a result value of the second arithmetic operation as a location storing second data of the piece of compressed data, the second data including Y–X bits of the piece of compressed data other than the X bits; and an output step of:
when the flag indicates that the length of the piece of compressed data does not exceed X bits, outputting, as a compressed code, the piece of compressed data included in the first data, and
when the flag indicates that the length of the piece of compressed data exceeds X bits, output a compressed code that is composed of the piece of compressed data included in the first data and the second data,
wherein the second arithmetic operation is selected from a plurality of second arithmetic operations based on a status of one or more pieces of special compressed data among the M pieces of compressed data.

14. The memory location determining device according to claim 1, further comprising:

a microprocessor; and a non-transitory computer-readable recording medium coupled to the microprocessor and storing a program, wherein the program, when executed by the microprocessor, configures the microprocessor to function as the first determiner and the second determiner.

15. A memory location determining device for determining locations in a memory, the locations for storing M pieces of compressed data each compressed from a corresponding one of M pieces of N-bit data to be less than N bits, the M pieces of N-bit data constituting a data block, the memory location determining device comprising:
- a microprocessor; and
- a non-transitory computer-readable recording medium coupled to the microprocessor and storing a program, wherein the program, when executed by the microprocessor, causes the microprocessor to perform:
  for each of the M pieces of compressed data, judging whether a piece of compressed data is a piece of ordinary compressed data or a piece of special compressed data, the piece of ordinary compressed data having a length of X bits or less, where X<N, the piece of special compressed data having a length of Y bits, where Y>X;
  with respect to each of the M pieces of compressed data, when it is judged that the piece of compressed data is a piece of special compressed data, dividing the piece of compressed data being a piece of special compressed data into first compressed data having a length of X bits and second compressed data having a length of Y−X bits;
  when a piece of compressed data is a piece of ordinary compressed data,
    determining a first location for storing first data, by performing a first arithmetic operation on an address value of the piece of ordinary compressed data in the data block,
    wherein the first data include all bits of the piece of ordinary compressed data and a first flag indicating that the length is X bits or less, and the first data have a length of L bits or less, where X<L<N,
  when a piece of compressed data is a piece of special compressed data,
    determining a second location for storing second data, by performing the first arithmetic operation on an address value of the piece of special compressed data in the data block; and
    determining a third location for storing third data, by performing a second arithmetic operation on the address value of the piece of special compressed data in the data block,
    wherein the second data include the first compressed data X and a second flag indicating that the length exceed X bits, and
    a third data include the second compressed data.

16. The memory location determining device of claim 15, wherein the second arithmetic operation is selected from a plurality of second arithmetic operations based on a status of one or more pieces of special compressed data among the M pieces of compressed data.

* * * * *